United States Patent
Murazaki et al.

(10) Patent No.: US 7,658,866 B2
(45) Date of Patent: *Feb. 9, 2010

(54) FLUORESCENT MATERIAL AND LIGHT-EMITTING DEVICE

(75) Inventors: Yoshinori Murazaki, Anan (JP);
Shinpei Kinoshita, Anan (JP);
Masatoshi Kameshima, Anan (JP);
Suguru Takashima, Anan (JP); Hiroto Tamaki, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/329,966

(22) Filed: Dec. 8, 2008

(65) Prior Publication Data
US 2009/0085458 A1 Apr. 2, 2009

Related U.S. Application Data

(62) Division of application No. 10/973,835, filed on Oct. 27, 2004, now Pat. No. 7,488,432.

(30) Foreign Application Priority Data

Oct. 28, 2003 (JP) ............................. 2003-367159
Apr. 21, 2004 (JP) ............................. 2004-124889

(51) Int. Cl.
*H01L 33/00* (2006.01)
*C09K 11/64* (2006.01)
*C09K 11/08* (2006.01)
*C09K 11/55* (2006.01)
*C09K 11/54* (2006.01)
*C09K 11/80* (2006.01)
*C09K 11/59* (2006.01)
*C09K 11/66* (2006.01)
*C09K 11/65* (2006.01)
*C09K 11/67* (2006.01)

(52) U.S. Cl. ............................. 252/301.4 R; 252/301.36; 252/301.6 R; 252/301.4 F; 252/301.6 F; 313/503; 313/502; 257/98; 349/70; 349/71; 345/36; 345/46; 345/82; 345/83

(58) Field of Classification Search .......... 252/301.4 R, 252/301.36, 301.6 R, 301.4 F, 301.6 F; 313/502; 257/98; 349/70, 71; 345/36, 46, 82, 83
See application file for complete search history.

(56) References Cited

U.S. PATENT DOCUMENTS 5,376,303 A 12/1994 Royce et al.

(Continued)

FOREIGN PATENT DOCUMENTS

JP H05-021848 A 1/1993

(Continued)

OTHER PUBLICATIONS

Non-Final Office Action dated Sep. 11, 2007, issueed in U.S. Appl. No. 10/973,835, filed Oct. 27, 2004, now U.S. Patent No. 7,488,432.

(Continued)

*Primary Examiner*—C. Melissa Koslow
(74) *Attorney, Agent, or Firm*—Global IP Counselors, LLP

(57) ABSTRACT

A fluorescent material includes first and second phosphors. The first phosphor is a light-storing phosphor, which is represented by the general formula $(M_{1-a-b}Eu_aQ_b)Al_2O_4$, wherein M is one type selected from the group consisting of Mg, Ca, Ba, Sr and Zn; Q is one type selected from the group consisting of Pr, Nd, Dy, Er and Ho; a is a number that satisfies $0.0001 \leq a \leq 0.5$; and b is a number that satisfies $0.010 \leq b \leq 0.5$. When the fluorescent material is excited for about 15 minutes by ultraviolet irradiation having about 365.0 nm wavelength with an intensity of 0.5 mW/cm², and the color of the afterglow of the fluorescent material is measured 1 minute and 10 minutes after excitation is terminated, an amount of change between chromaticity measured 1 minute after excitation and that measured 10 minutes is in the range of $-0.001 \leq x \leq 0.009$ and $-0.009 \leq y \leq 0.006$.

12 Claims, 10 Drawing Sheets

U.S. PATENT DOCUMENTS

| | | | |
|---|---|---|---|
| 5,424,006 A * | 6/1995 | Murayama et al. | 252/301.4 R |
| 5,839,718 A | 11/1998 | Hase et al. | |
| 6,617,781 B2 | 9/2003 | Murazaki et al. | |
| 6,682,663 B2 * | 1/2004 | Botty et al. | 252/301.4 R |
| 6,762,551 B2 * | 7/2004 | Shiiki et al. | 313/503 |
| 6,809,471 B2 * | 10/2004 | Setlur et al. | 313/503 |
| 7,059,927 B2 * | 6/2006 | Wang et al. | 445/23 |
| 7,064,480 B2 * | 6/2006 | Bokor et al. | 313/503 |
| 7,176,612 B2 * | 2/2007 | Omoto et al. | 313/487 |
| 7,488,432 B2 * | 2/2009 | Murazaki et al. | 252/301.4 R |
| 2003/0024438 A1* | 2/2003 | Botty et al. | 106/481 |
| 2003/0155856 A1* | 8/2003 | Shiiki et al. | 313/483 |

FOREIGN PATENT DOCUMENTS

| | | | |
|---|---|---|---|
| JP | H05-314855 A | | 11/1993 |
| JP | H08-151573 A | | 6/1996 |
| JP | H10-188649 A | | 7/1998 |
| JP | H11-144683 A | | 5/1999 |
| JP | H11-236524 A | | 8/1999 |
| JP | 2003-147351 A | | 5/2003 |
| WO | WO 02/11214 | * | 2/2002 |
| WO | WO-02/11214 A1 | | 2/2002 |

OTHER PUBLICATIONS

Final Office Action dated Mar. 17, 2008, issued in U.S. Appl. No. 10/973,835, filed Oct. 27, 2004, now U.S. Patent No. 7,488,432.

* cited by examiner (a)

(b)

(a)

(b)

FLUORESCENT MATERIAL AND LIGHT-EMITTING DEVICE

CROSS-REFERENCE TO RELATED APPLICATIONS

This application is a divisional application of U.S. patent application Ser. No. 10/973,835 filed on Oct. 27, 2004, which issued as U.S. Pat. No. 7,488,432. The entire disclosure of U.S. patent application Ser. No. 10/973,835 is hereby incorporated herein by reference.

BACKGROUND OF THE INVENTION (1) Field of the Invention

The present invention is directed to a fluorescent material having a characteristic of producing an afterglow of high luminosity for a substantially long period of time, and a lamp having a characteristic of producing an afterglow of high luminosity for a substantially long period of time. In particular, the present invention is directed to a fluorescent material having a characteristic of producing an afterglow of high luminosity across a broad chromatic range, and a lamp having a characteristic of producing an afterglow of high luminosity across a broad chromatic range.

Furthermore, the present invention relates to a light-emitting device that can be used as a backlight source, light-emitting diode (LED) display, signal lamp, indicator, or light source in various applications, and to a display unit equipped with it. In particular, the present invention relates to a light-emitting device containing a fluorescent material that emits light by at least partially converting the light of an LED chip and having a characteristic of highly efficiently producing an afterglow of high luminosity irrespective of the environment, and to a display unit equipped with it.

(2) Description of Related Art

Some fluorescent materials, once exposed to sunlight or artificial lighting, produce an afterglow in a dark place for a relatively long period of time. Fluorescent materials that exhibit this feature repeatedly are called light-storing fluorescent materials. With increasing awareness of the importance of disaster prevention in recent years, the use of light-storing fluorescent materials, which emit light in a dark place, is expanding throughout the field of disaster prevention. Moreover, the application of light-storing fluorescent materials is broadening due to the use thereof in plastics for the production of plates, sheets, etc.

Heretofore, green-light-emitting ZnS:Cu phosphors have been used as light-storing fluorescent materials, but the properties thereof are unsatisfactory because the afterglow luminosity of such phosphors is not intense enough to be perceived over several tens of hours, and the phosphors are photodegraded by ultraviolet radiation, after which colloidal zinc metal precipitates on the surface of the phosphor crystal, thereby blackening its appearance and significantly impairing its afterglow luminosity. Such degradation is likely to occur under hot and humid conditions. It is difficult to completely prevent this problem. Therefore, the use of ZnS:Cu phosphors in a place involving exposure to direct sunlight, e.g., outdoors, should be avoided.

Japanese Unexamined Patent Publication No. 1995-11250 discloses "a light-storing phosphor in which the mother crystal is of a compound represented by $MAl_2O_4$ wherein M is at least one metal element selected from the group consisting of calcium, strontium, and barium". This light-storing phosphor is described as emitting an afterglow for a considerably longer period of time than the aforementioned sulfur-based phosphors, and having chemical stability and superior long-term photoresistance. In Japanese Unexamined Patent Publication No. 1995-11250, the light-storing phosphor is described as emitting a bluish-purple to green light.

Japanese Unexamined Patent Publication No. 1996-170076 discloses a long-afterglow phosphor represented by the formula $MO.a(Al_{1-b}B_b)_2O_3:cR$ wherein a, b and c are in the ranges given below:

$0.5 \leq a \leq 10.0$, $0.0001 \leq b \leq 0.5$, $0.0001 \leq c \leq 0.2$, provided that MO represents at least one divalent metal oxide selected from the group consisting of MgO, CaO, SrO and ZnO; and R represents $Eu^{2+}$ and at least one additional rare earth element selected from the group consisting of Pr, Nd, Dy and Tm. This invention can be considered as having overcome the notable disadvantage presented by the aforementioned sulfur-based phosphors. In Japanese Unexamined Patent Publication No. 1996-170076, the long-afterglow phosphor is described as emitting a bluish green light.

WO00/11106 discloses "of a rare earth oxysulfide phosphor activated by europium, a red-light-emitting afterglow photoluminescence phosphor represented by the chemical formula:

$$Ln_2O_2S:Eu_x,M_y$$

$0.00001 \leq x \leq 0.5$ $0.00001 \leq y \leq 0.3$ wherein Ln is at least one member selected from the group consisting of Y, La, Gd and Lu; and M is a coactivator and is at least one member selected from the group consisting of Mg, Ti, Nb, Ta and Ga". This invention can be considered as having overcome the notable disadvantage presented by the aforementioned sulfur-based phosphors. In WO00/11106, the red-light-emitting afterglow photoluminescence phosphor is described as emitting red light.

However, it is very difficult to create an intermediate color of the emission colors of the aforementioned light-storing phosphors, i.e., producing white from green, bluish purple, bluish green and red created by the light-storing phosphors, because the attenuation behavior of the afterglow luminosity and the excitation behavior of each light-storing phosphor are different, and therefore maintaining a white afterglow for a long period of time is almost impossible.

Color control is also difficult for other intermediate colors, due to the difference in the excitation behavior and the attenuation behavior of the afterglow luminosity among the light-storing phosphors. Therefore, there has been no commercial production of phosphors that can create intermediate colors.

Japanese Unexamined Patent Publication No. 1996-151573 discloses "of an aluminate phosphor activated by divalent europium, an afterglow phosphor represented by the chemical formula $(Ca_{1-p-q-r}Eu_pNd_qMn_r)O.n(Al_{1-m}B_m)_2O_3.kP_2O_6$ wherein $0.0001 \leq p \leq 0.5$, $0.00005 \leq q \leq 0.5$, $0.00005 \leq r \leq 0.7$, $0.0001 \leq p+q+r \leq 0.75$, $0.0001 \leq m \leq 0.5$, $0.5 \leq n \leq 3.0$, $0 \leq k \leq 0.2$ $1 \leq r/p \leq 20$". This aluminate phosphor having a characteristic of producing an afterglow is described as being able to create an afterglow hue that had not been possible with conventional aluminate phosphors having afterglow properties. In Japanese Unexamined Patent Publication No. 1996-151573, the afterglow phosphor is described as emitting white light.

Apparatuses furnished with phosphors include, for example, LEDs and fluorescent lamps. For the purpose of describing common applications of LEDs, the number of devices equipped with liquid crystals is increasing due to the advancement of laptop computers and portable electronic devices. Such liquid crystal devices are furnished with backlights to enable viewing in dark places. Such backlights are required to consume little power while emitting light with high luminosity because low power consumption results in longer operation of liquid crystal devices. Some backlights achieve high luminosity by allowing LED chips, used as a backlight source, to emit light in a planar or like manner. LED chips are used in LED displays. Such LED chips are small and efficiently emit light having vivid colors. LED chips are free from burning out and thus offer a long life. Moreover, LED chips exhibit superior characteristics at the initial stage of their operation and are advantageous in resistance to vibration and repetitive light on/light off operation. With respect to LED chips, further reduction in power consumption is desired for applications such as backlight sources and LED displays. In particular, for guidance lights, the installation of which is mandated by the Fire Service Law enforcement ordinance and the fire prevention ordinances established in municipalities throughout the country, display units are required that can provide sufficient luminosity even when the power supply is weak or when the power supply system has ceased to operate.

Light-emitting devices equipped with an LED and a phosphor excited by the LED are examples of display units that meet such requirements. As taught in, for example, Japanese Unexamined Patent Publication No. 1993-314855, by combining an LED and a light-storing (afterglow-producing) phosphor, display units can maintain their light presentation for a desired period of time due to the afterglow of the phosphor even when their power supply is weak or when their power supply system has ceased to operate. For applications in dark places, such as in a switch panel for an electric light, display units do not have to be lit all the time, and the power consumption can be reduced, by intermittently shutting off the electric light, to take advantage of the light emitted by the LED and the light emitted by a light-storing phosphor that is excited by the LED light.

However, conventional light-emitting devices making use of the combination of an LED chip and a light-storing phosphor produce an afterglow of limited color variation, for example, blue and bluish green. Light-emitting devices that produce an afterglow of many different colors are desired.

BRIEF SUMMARY OF THE INVENTION

An object of the present invention is to provide a fluorescent material that can produce an afterglow of high luminosity across a significantly broad chromatic range, and a lamp, light-emitting device and display unit equipped with the fluorescent material.

In particular, the present invention provides fluorescent materials, lamps, light-emitting devices, and display units as described below.

A fluorescent material according to one aspect of the invention includes a first phosphor that at least partially converts energy emitted by an excitation source to a first emission spectrum that is different from the energy, and a second phosphor that at least partially converts the first emission spectrum to a second emission spectrum that is different from the first emission spectrum. The first phosphor is a light-storing phosphor, which is a phosphor which is represented by the general formula: $(M_{1-a-b}Eu_aQ_b)Al_2O_4$; wherein M is at least one type selected from the group consisting of Mg, Ca, Ba, Sr and Zn; Q is at least one type selected from the group consisting of Pr, Nd, Dy, Er and Ho; a is a number that satisfies $0.0001 \leq a \leq 0.5$; and b is a number that satisfies $0.0001 \leq b \leq 0.5$. A peak wavelength of the emission spectrum of the first phosphor and a peak wavelength of the emission spectrum of the second phosphor have a relation of complementary colors, so that when the light created due to the peak wavelength of the first phosphor and the light created due to the peak wavelength of the second phosphor are mixed, the resulting light is in the white region. The first and second phosphors are configured and arranged so that, when the fluorescent material is excited for about 15 minutes by ultraviolet irradiation having about 365.0 nm wavelength using a black light lamp with an intensity of 0.5 mW/cm² as an excitation source, and the color of the afterglow of the fluorescent material is measured 1 minute and 10 minutes after excitation is terminated, an amount of change between chromaticity of the afterglow measured 1 minute after excitation and that measured 10 minutes after excitation is in the range of $-0.001 \leq x \leq 0.009$ and $-0.009 \leq y \leq 0.006$.

DETAILED DESCRIPTION OF THE INVENTION

Figure 1:
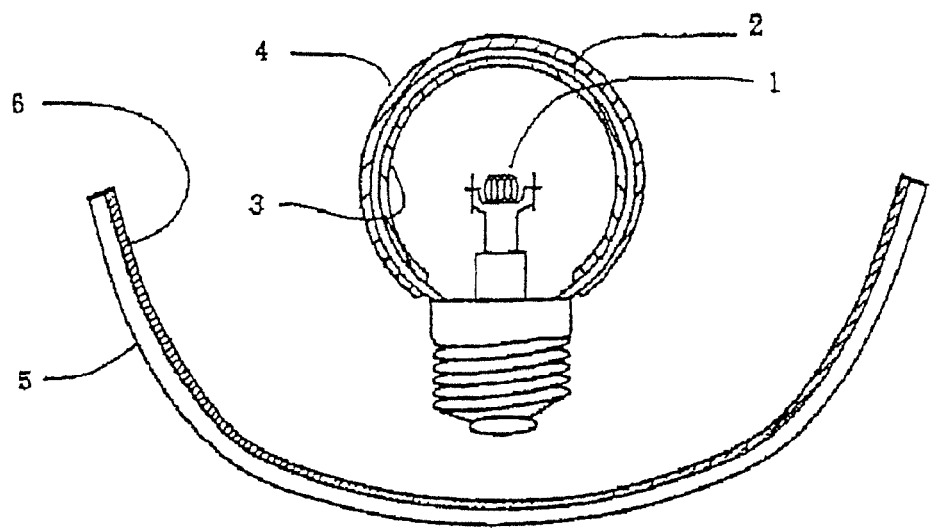
FIG. 1 is a sectional view of a lamp of an embodiment of the invention in conjunction with a reflective panel having an afterglow property.

Hereinbelow the present invention is described in detail. However, the invention is not limited to the embodiments given below. The fluorescent material of the present invention is described first. The lamp, light-emitting device, and display unit equipped with the fluorescent material are described thereafter.

(I) Fluorescent Materials

Fundamental Construction

Fluorescent material (I) of the present invention comprises a light-storing first phosphor that at least partially converts the energy emitted by an excitation source to emit light having a first emission spectrum that is different from the spectrum of the energy and a second phosphor that at least partially converts the first emission spectrum to emit light having a second emission spectrum that is different from the first emission spectrum.

Light-storing phosphors herein include materials that absorb and store energy from external sources and then gradually release the stored energy as light.

Excitation sources are not limited, and known excitation sources can be used herein. Examples of known excitation sources are electromagnetic waves such as sunlight, ultraviolet rays, electron beams, visible light, X rays, infrared rays, radioactive rays, etc.

The second phosphor may at least partially convert the energy emitted by an excitation source and the energy of the emission spectrum of the first phosphor to emit light whose spectrum is different from those of the energies of the excitation source and the first phosphor.

Although the first phosphor and the second phosphor can be used singly to attain sufficient effect, the fluorescent material of the invention, by having the first phosphor and the second phosphor in combination, can emit a high-luminosity afterglow across a significantly broad chromatic range.

Since the second phosphor has a substantially stable energy conversion rate irrespective of the intensity of the first phosphor emission, it can maintain an afterglow with a uniform or substantially uniform chromaticity for a long period of time. In other words, the chromaticity of its afterglow does not change or substantially does not change for a long period of time.

Fluorescent material (II) of the invention comprises a light-storing first phosphor that at least partially converts the energy emitted by an excitation source to emit light having a first emission spectrum that is different from the spectrum of the energy and a second phosphor that, even after the energy supply by the excitation source is terminated, at least partially converts the first emission spectrum to emit light having a second emission spectrum that is different from the first emission spectrum.

It is sufficient that the second phosphor in fluorescent material (II) at least partially converts the first emission spectrum to emit light before the energy supply by the excitation source is terminated. The second phosphor may at least convert the energy emitted by the excitation source and the first emission spectrum before the energy supply by the excitation source is terminated, and emit light having the second emission spectrum that is different from the emission spectra of the excitation source and the first phosphor. Other particulars described in connection with fluorescent material (I) also apply to fluorescent material (II).

Fluorescent material (III) of the invention comprises a layer containing a light-storing first phosphor that at least partially converts the energy emitted by an excitation source to emit light having a first emission spectrum that is different from the spectrum of the energy, and a layer containing a second phosphor that at least partially converts the first emission spectrum to emit light having a second emission spectrum that is different from the first emission spectrum.

Fluorescent material (III) can emit light having a uniform chromaticity due to the first phosphor and the second phosphor being disposed in the form of layers.

Fluorescent material (III) preferably contains 1 to 3 layers each containing the first phosphor and the second phosphor. If there is only one layer for each phosphor, the first phosphor layer is preferably positioned closer to the excitation source than the second phosphor layer. If there are a plurality of first phosphor layers and second phosphor layers, a first phosphor layer and a second phosphor layer should alternate with the layer disposed closest to the excitation source being a first phosphor layer. Such a construction results in a broadened chromatic range and easy chromatic control. The thickness of the first phosphor layer and the second phosphor layer varies depending on the application. When the fluorescent material is used for a lamp, it is sufficient that the thickness of the first phosphor layer be about 5 to about 100 μm and the thickness of second phosphor layer be about 5 to about 100 μm. Other particulars described in connection with fluorescent material (I) also apply to fluorescent material (III).

Fluorescent material (IV) comprises a light-storing first phosphor that at least partially absorbs the energy emitted by an excitation source to emit phosphorescence, and a second phosphor that partially absorbs the phosphorescence of the first phosphor and converts the wavelength thereof to emit fluorescence. This fluorescent material is able to emit light having a spectrum created by the combination of the portion of the phosphorescence of the first phosphor that is not absorbed by the second phosphor and the fluorescence of the second phosphor.

Usable excitation sources, properties of the second phosphor, and effects of fluorescent material (IV) are as described with respect to fluorescent material (I).

Fluorescent material (V) comprises a light-storing first phosphor that at least partially absorbs the energy emitted by an excitation source to emit phosphorescence, and a second phosphor that partially absorbs the phosphorescence of the first phosphor and converts the wavelength thereof to emit fluorescence. The wavelength range covered by the emission spectrum of the first phosphor at least partially overlaps with the wavelength range of the excitation spectrum of the second phosphor.

With respect to fluorescent material (V), the emission spectrum of the first phosphor is preferably within the excitation spectrum of the second phosphor, thereby achieving efficient energy conversion not only during power supply but also after the power supply is terminated, resulting in an emission having enhanced luminosity.

Usable excitation sources, properties of the second phosphor, and effects of fluorescent material (V) are as described in connection with fluorescent material (I).

Emission Spectra of the First Phosphor and the Second Phosphor

In the present invention, the first phosphor and the second phosphor may be independently composed of a single type of phosphor, or two or more types of phosphor, thereby increasing emission spectrum combinations, and when a suitable combination is selected, a fluorescent material having excellent color rendering properties, luminosity, and like features is obtained. When the second phosphor is to be excited by the first phosphor, if a plurality of first phosphors of different types are used, not all of the first phosphors have to excite the second phosphor, and it is sufficient that some of the first phosphors excite the second phosphor. As described above, the second phosphor may be excited by the light emitted by a first phosphor and the light emitted by an excitation source.

The first phosphor preferably has an emission spectrum such that an emission is observable in the range of about 400 to about 800 nm, thereby enabling an emission with high luminosity across a broad chromatic range to be obtained and substantially consistent chromaticity to be maintained for a long period of time.

With respect to fluorescent materials (I) to (V), it is preferable that the emission spectrum of the first phosphor and/or the second phosphor preferably has two or more peaks, and that two of the spectrum peaks have a relation of complementary colors. In this case, a high-luminosity afterglow in the white region can be efficiently obtained due to the two peaks that have the relation of complementary colors. In other words, a high-luminosity afterglow in the white region can be readily obtained.

With respect to the fluorescent materials of the invention, the first phosphor preferably has an emission spectrum with a peak that has a relation of complementary colors with the peak of the emission spectrum of the second phosphor. In this case also, high-luminosity afterglow in the white region can be efficiently obtained. Moreover, such an emission in the white region has little color irregularity. If the second phosphor is designed to be excited by the first phosphor, when the first phosphor is degraded, the second phosphor is excited to a lesser extent so that color deviation can thereby be reduced despite reduced output and emission efficiency. Even when the first phosphor and the second phosphor are each composed of a single or multiple types of phosphor, it is possible to fabricate the first phosphor and the second phosphor to have a relation of complementary colors, thereby giving the fluorescent material excellent color rendering properties.

The phrase "relation of complementary colors" herein means that when the light created due to the peak wavelength of one phosphor and the light created due to the peak wavelength of the other phosphor are mixed, the resulting light is in the white region, for example, blue and yellow, bluish green and red, etc. Greenish white, bluish white, purplish white, reddish white, yellowish white, and the like are included in the white region. Colors having a Munsell nonation system of about 5 to about 10 are included in the white region irrespective of hue. In the present invention, with respect to the two peaks that have a relationship of complementary colors, one peak is preferably within the range of about 380 to about 485 nm, and the other peak is preferably in the range of about 575 to about 630 nm.

On the chromatic diagram, colors situated on the line perpendicular to the locus of blackbody radiation have the same color temperature despite differences in hue. Therefore, the preferable white region cannot be determined by a difference in color temperature that is expressed in the direction perpendicular to the locus of the blackbody radiation. However, at the same color temperature, the brightest emission is indicated on the locus of the blackbody radiation. Therefore, in view of emission efficiency, the two peaks are preferably designed such that the mixed color created by the lights due to the two peaks that have a relation of complementary colors is on the locus of the blackbody radiation or adjacent thereto.

The fluorescent materials of the invention may contain a third phosphor having its peak emission wavelength between the peak emission wavelengths of lights that have a relation of complementary colors, thereby enabling an emission in the white region to be obtained and a fluorescent material that can emit a desired highly luminous intermediate color to be obtained.

With respect to the fluorescent materials of the invention, the ratio of intensity between two peak emission wavelengths that have a relation of complementary colors can be controlled by adjusting the construction of the phosphors to attain a desired color of emitted light. In this manner, the color of emitted light which is in the white region can be fine-tuned such that humans can clearly perceive it.

Specific Examples of First Phosphors

In the fluorescent material of the present invention, the first phosphor is preferably composed of at least one type selected from the group consisting of sulfide-based phosphors, aluminate-based phosphors and oxysulfide-based phosphors.

Preferable modes of the first phosphor are described in (1) to (8) below. Phosphors described in such preferable modes can be used singly or as a combination of two or more types.

(1) Sulfide-based phosphors wherein S and at least one element M selected from the group consisting of Mg, Ca, Ba, Sr, Zn and Cd are activated by at least one element M' selected from the group consisting of Cu, Mn, Eu, Cl and Ag.

(2) Among sulfide-based phosphors (1), those represented by the general formula MS:M' wherein M is at least one type selected from the group consisting of Mg, Ca, Ba, Sr, Zn and Cd, and M' is at least one type selected from the group consisting of Cu, Mn, Eu, Cl and Ag.

(3) Aluminate-based phosphors wherein O, Al, and at least one element M selected from the group consisting of Mg, Ca, Ba, Sr and Zn are activated by Eu and at least one element Q selected from the group consisting of Pr, Nd, Dy, Er and Ho.

(4) Among aluminate-based phosphors (3), those represented by the general formula $(M_{1-a-b}Eu_aQ_b)O \cdot n(Al_2O_3)$ wherein M is at least one type selected from the group consisting of Mg, Ca, Ba, Sr and Zn; Q is at least one type selected from the group consisting of Pr, Nd, Dy, Er and Ho; a is a number that satisfies $0.001 \leq a \leq 0.5$; b is a number that satisfies $0.0001 \leq b \leq 0.5$; and n is a number that satisfies $0.5 \leq n \leq 3$.

When the first phosphor is aluminate-based phosphor (3), or aluminate-based phosphor (4), in particular, its water resistance and heat resistance are enhanced without impairing the effects of the invention, such as attaining an afterglow across a significantly broad chromatic range and maintaining a consistent afterglow chromaticity for a long period of time.

(5) Boron-containing aluminate-based phosphors wherein O, Al, B and at least one element M selected from the group consisting of Mg, Ca, Ba, Sr and Zn are activated by Eu and at least one element Q selected from the group consisting of Pr, Nd, Dy, Er and Ho.

(6) Among boron-containing aluminate-based phosphors (5), those represented by the general formula $(M_{1-a-b}Eu_aQ_b)O \cdot n(Al_{1-m}B_m)_2O_3$ wherein M is at least one type selected from the group consisting of Mg, Ca, Ba, Sr and Zn; Q is at least one type selected from the group consisting of Pr, Nd, Dy, Er and Ho; a is a number that satisfies $0.0001 \leq a \leq 0.5$; b is a number that satisfies $0.0001 \leq b \leq 0.5$; n is a number that satisfies $0.5 \leq n \leq 3$; and m is a number that satisfies $0 < m \leq 0.5$.

When the first phosphor is boron-containing aluminate-based phosphor (5), or boron-containing aluminate-based phosphor (6), in particular, its water resistance and heat resistance are enhanced without impairing the effects of the invention, such as attaining an afterglow across a significantly broad chromatic range and maintaining a consistent afterglow chromaticity for a long period of time. Moreover, due to the presence of boron, the duration of the afterglow and luminosity are further enhanced.

(7) Oxysulfide-based phosphors wherein O, S and at least one element Ln selected from the group consisting of Y, La, Gd and Lu are activated by Eu and at least one element M selected from the group consisting of Mg, Ti, Nb, Ta and Ga.

(8) Among oxysulfide-based phosphors (7), those represented by the general formula $Ln_2O_2S:Eu_x,M_y$ wherein Ln is at least one type selected from the group consisting of Y, La, Gd and Lu; M is at least one type selected from the group consisting of Mg, Ti, Nb, Ta and Ga; x is a number that satisfies $0.00001 \leq x \leq 0.5$; and y is a number that satisfies $0.00001 \leq y \leq 0.3$.

When the first phosphor is oxysulfide-based phosphor (7), in particular, oxysulfide-based phosphor (8), its chemical stability is enhanced without impairing the effects of the invention, such as attaining an afterglow across a significantly broad chromatic range and maintaining a consistent afterglow chromaticity for a long period of time.

With respect to phosphors (4) and (6), a preferably satisfies $0.001 \leq a \leq 0.1$, and b preferably satisfies $0.001 \leq b \leq 0.1$. When a and b are within the aforementioned ranges, the afterglow luminosity is sufficient for practical use due to sufficient light absorption, no reduction of afterglow luminosity due to concentration quenching occurs, and no chromatic deviation occurs.

Among the examples of phosphors usable for the first phosphor given above, phosphors (3), (4), (5) and (6) are preferable, with phosphors (4) and (6) being particularly preferable.

Specific Examples of Second Phosphors

With respect to the fluorescent materials of the invention, the second phosphor emits a light whose spectrum is different from the emission spectra of the excitation source and the first phosphor. The second phosphor may be excited by the excitation source and/or the first phosphor.

The second phosphor preferably has, when the maximum peak of its emission intensity in response to an excitation energy of 200 to 400 nm is regarded as 100%, an emission intensity of at least 15%, and more preferably at least 35%, in response to an excitation energy of 400 to 800 nm. In this case, the effects of the invention, such as attaining an afterglow across a significantly broad chromatic range and maintaining a consistent afterglow chromaticity for a long period of time, can be attained with enhanced efficiency.

In the fluorescent material of the invention, the second phosphor is preferably composed of at least one member selected from the group consisting of cerium-activated yttrium aluminum oxide-based phosphors, cerium-activated rare-earth aluminum oxide-based phosphors, nitride-based phosphors, oxynitride-based phosphors and silicate-based phosphors.

Preferable modes of the second phosphor are described in (9) to (16) below. Phosphors described in such preferable modes can be used singly or as a combination of two or more types.

(9) Cerium-activated yttrium aluminum oxide-based phosphors wherein Y that has been entirely or partially substituted by at least one element selected from the group consisting of Lu, Sc, La, Gd, Pr, Tb and Sm; Al; and O are activated by cerium;

cerium-activated rare-earth aluminum oxide-based phosphors wherein Y that has been entirely or partially substituted by at least one element selected from the group consisting of Lu, Sc, La, Gd, Pr, Tb and Sm; Al; at least one element selected from the group consisting of Tl, Ga and In; and O are activated by Ce;

cerium-activated rare-earth aluminum oxide-based phosphors wherein Y that has been entirely or partially substituted by at least one element selected from the group consisting of Lu, Sc, La, Gd, Pr, Tb and Sm; at least one element selected from the group consisting of Al, Tl, Ga and In; and O are activated by Ce.

(10) Among phosphors (9), those that are represented by the general formula $(Y_zGd_{1-z})_3Al_5O_{12}$:Ce wherein z is a number that satisfies $0 < z \leq 1$, or $(A_{1-a}Sm_a)_3A'_5O_{12}$:Ce wherein A is at least one type selected from the group consisting of Y, Lu, Sc, La, Gd, Pr and Tb; A' is at least one type selected from the group consisting of Al, Ga and In; and a is a number that satisfies $0 \leq a < 1$.

The use, as the second phosphor, of cerium-activated yttrium aluminum oxide-based phosphor (9), or cerium-activated yttrium aluminum oxide-based phosphor (10) in particular, enables uniform chromaticity to be maintained without impairing the effects of the invention, such as attaining an afterglow across a significantly broad chromatic range and maintaining a consistent afterglow chromaticity for a long period of time.

Among cerium-activated rare-earth aluminum oxide-based phosphors (10), particularly preferable are those represented by the general formula $(A_{1-a}Sm_a)_3A'_5O_{12}$:Ce wherein A is at least one type selected from the group consisting of Y, Lu, Sc, La, Gd, Pr and Tb; A' is at least one type selected from the group consisting of Al, Ga and In; and a is a number that satisfies $0 \leq a < 1$.

(11) Nitride-based phosphors wherein at least one element L selected from the group consisting of Be, Mg, Ca, Sr, Ba and Zn; at least one element D selected from the group consisting of C, Si, Ge, Sn, Ti, Zr and Hf; and N are activated by element R selected from the group consisting of Y, La, Ce, Pr, Nd, Sm, Eu, Gd, Tb, Dy, Ho, Er and Lu.

(12) Among nitride-based phosphors (11), those represented by the general formula $L_xD_yN_{(2/3)x+(4/3)y}$:R wherein L is at least one type selected from the group consisting of Be, Mg, Ca, Sr, Ba and Zn; D is at least one type selected from the group consisting of C, Si, Ge, Sn, Ti, Zr and Hf; R is at least one type selected from the group consisting of Y, La, Ce, Pr, Nd, Sm, Eu, Gd, Tb, Dy, Ho, Er and Lu; x is a number that satisfies $0.5 \leq x \leq 3$; and y is a number that satisfies $1.5 \leq y \leq 8$.

When the second phosphor is a nitride-based phosphor (11), or nitride-based phosphor (12) in particular, the heat resistance can be enhanced without impairing the effects of the invention, such as attaining an afterglow across a significantly broad chromatic range and maintaining a consistent afterglow chromaticity for a long period of time.

(13) Oxynitride-based phosphors wherein at least one element L selected from the group consisting of Be, Mg, Ca, Sr, Ba and Zn; at least one element D selected from the group consisting of C, Si, Ge, Sn, Ti, Zr and Hf; N; and O are activated by at least one element R selected from the group consisting of Y, La, Ce, Pr, Nd, Sm, Eu, Gd, Tb, Dy, Ho, Er and Lu.

(14) Among oxynitride-based phosphors (13), those represented by the general formula $L_xD_yO_zN_{((2/3)x+(4/3)y-(2/3)z)}$:R wherein L is at least one type selected from the group consisting of Be, Mg, Ca, Sr, Ba and Zn; D is at least one type selected from the group consisting of C, Si, Ge, Sn, Ti, Zr and Hf; R is at least one type selected from the group consisting of Y, La, Ce, Pr, Nd, Sm, Eu, Gd, Tb, Dy, Ho, Er and Lu; x is a number that satisfies $0.5 \leq x \leq 3$; y is a number that satisfies $1.5 \leq y \leq 8$; and z is a number that satisfies $0 < z \leq 3$.

When the second phosphor is an oxynitride-based phosphor (13), or oxynitride-based phosphor (14) in particular, the heat resistance can be enhanced without impairing the effects of the invention, such as attaining an afterglow across a significantly broad chromatic range and maintaining a consistent afterglow chromaticity for a long period of time.

(15) Silicate-based phosphors wherein at least one element L selected from the group consisting of Be, Mg, Ca, Sr, Ba and Zn; O; Si are activated by Eu.

(16) Among silicate-based phosphors (15), those represented by the general formula $(L_{1-x}Eu_x)O.nSiO_2$ wherein L is at least one type selected from the group consisting of Be, Mg, Ca, Sr, Ba and Zn; x is a number that satisfies $0.001 \leq x \leq 0.5$; and n is a number that satisfies $0.1 \leq n \leq 10$.

When the second phosphor is a silicate-based phosphor (15), or silicate-based phosphor (16) in particular, the water resistance can be enhanced without impairing the effects of the invention, such as attaining an afterglow across a significantly broad chromatic range and maintaining a consistent afterglow chromaticity for a long period of time.

Among the examples of the second phosphor given above, phosphors (9), (10), (11), (12), (13) and (14) are preferable, and phosphors (10) and (12) are particularly preferable.

With respect to the fluorescent material of the invention, the second phosphor may be combinations of at least one member selected from the group consisting of cerium-activated yttrium aluminum oxide-based phosphors, cerium-activated rare-earth aluminum oxide-based phosphors, nitride-based phosphors, oxynitride-based phosphors and silicate-based phosphors, and at least one type of phosphor described in (17) to (29) below:

(17) Eu-activated alkaline earth metal halogen apatite phosphors containing at least one element M1 selected from the group consisting of Mg, Ca, Ba and Sr; optionally Zn; at least one element L1 selected from the group consisting of Mn, Fe, Cr and Sn; P; O; and at least one element X selected from the group consisting of F, Cl, Br and I.

(18) Phosphors represented by the general formula $(M1_{1-a-b}Eu_aL1_b)_{10}(PO_4)_6X_2$ wherein M1 is at least one type selected from the group consisting of Mg, Ca, Ba, Sr and Zn; L1 is at least one type selected from the group consisting of Mn, Fe, Cr and Sn; X is at least one type selected from the group consisting of F, Cl, Br and I; a is a number that satisfies $0.0001 \leq a \leq 0.5$; and b is a number that satisfies $0.0001 \leq b \leq 0.5$.

Among phosphors (18), those that have Mn as L1 are preferable.

(19) Among phosphors (17), those represented by the general formula $(M1_{1-a}Eu_a)_{10}(PO_4)_6X_2$ wherein M1 is at least one type selected from the group consisting of Mg, Ca, Ba, Sr and Zn; X is at least one type selected from the group consisting of F, Cl, Br and I; and a is a number that satisfies $0.0001 \leq a \leq 0.5$.

(20) Phosphors represented by the general formula $(M2_{1-a-b}Eu_aBa_b)_{10}(PO_4)_6X_2$ wherein M2 is at least one type selected from the group consisting of Mg, Ca, Sr and Zn; X is at least one type selected from the group consisting of F, Cl, Br and I; a is a number that satisfies $0.0001 \leq a \leq 0.5$; and b is a number that satisfies $0.0001 \leq b \leq 0.5$.

(21) Phosphors represented by the general formula $(M1_{1-a}Eu_a)Al_2O_4$ wherein M1 is at least one type selected from the group consisting of Mg, Ca, Ba, Sr and Zn; and a is a number that satisfies $0.0001 \leq a \leq 0.5$.

(22) Phosphors represented by the general formula $(M1_{1-a-b}Eu_aMn_b)Al_2O_4$ wherein M1 is at least one type selected from the group consisting of Mg, Ca, Ba, Sr and Zn; a is a number that satisfies $0.0001 \leq a \leq 0.5$; and b is a number that satisfies $0.0001 \leq b \leq 0.5$.

(23) Phosphors represented by the general formula $(M3_{1-a-b}Eu_aCa_b)Al_2O_4$ wherein M3 is at least one type selected from the group consisting of Mg, Ba, Sr and Zn; a is a number that satisfies $0.0001 \leq a \leq 0.5$; and b is a number that satisfies $0.0001 \leq b \leq 0.5$.

(24) Phosphors represented by the general formula $M4_{1-a}Eu_a)MgAl_{10}O_{17}$ wherein M4 is at least one type selected from the group consisting of Ca, Ba, Sr and Zn; and a is a number that satisfies $0.0001 \leq a \leq 0.5$.

(25) Phosphors represented by the general formula $(M4_{1-a}Eu_a)(Mg_{1-b}Mn_b)Al_{10}O_{17}$ wherein M4 is at least one type selected from the group consisting of Ca, Ba, Sr and Zn; and a is a number that satisfies $0.0001 \leq a \leq 0.5$.

(26) Phosphors represented by the general formula $(M1_{1-a}Eu_a)_4Al_{14}O_{25}$ wherein M1 is at least one type selected from the group consisting of Mg, Ca, Ba, Sr and Zn; and a is a number that satisfies $0.0001 \leq a \leq 0.5$.

(27) Phosphors represented by ZnS:Cu.

(28) Phosphors represented by (Zn, Cd)S:Cu,Mn.

(29) Phosphors represented by $A_2O_2S$:Eu wherein A is at least one type selected from the group consisting of Sc, Y, La, Gd and Lu.

With respect to phosphors (17) to (29), a is preferably 0.005 or greater, and more preferably 0.01 or greater. Furthermore, a is preferably 0.4 or smaller, and more preferably 0.2 or smaller. When a is an excessively small number, the luminosity is likely to be impaired. When a is an excessively large number, the luminosity is likely to be reduced due to concentration quenching. When a is within the ranges specified herein, no such problem occurs.

In addition, b is preferably 0.005 or greater, and more preferably 0.01 or greater. Furthermore, b is preferably 0.4 or smaller, and more preferably 0.3 or smaller. When b is an excessively large number, the luminosity is likely to be reduced due to concentration quenching. When b is within the aforementioned ranges, no such problem occurs.

Among phosphors (17) to (29), phosphor (21) is preferable. With respect to the second phosphor, a combination of phosphor (21) and one phosphor selected from (9), (10), (11), (12), (13) or (14) is preferable, and a combination of phosphor (21) and phosphor (10) or (12) is more preferable. Use of such combinations makes it possible to obtain emissions having a color in the white region and further enhanced color rendering properties.

Preferable Combinations of the First and Second Phosphors

Examples of preferable combinations of the first and second phosphors are given in (A) to (C) below:

(A) A combination of phosphor (3) for the first phosphor and phosphor (9) for the second phosphor; a combination of phosphor (5) for the first phosphor and phosphor (9) for the second phosphor; and a combination of phosphors (3) and (5) for the first phosphor and phosphor (9) for the second phosphor.

Such combinations allow fluorescent materials that can produce a high-luminosity afterglow across a significantly broad chromatic range to be more efficiently obtained. In particular, such combinations allow the fluorescent material to efficiently emit light in the white region, and enhance water resistance and heat resistance.

In the aforementioned combinations, phosphor (3) for the first phosphor is preferably an aluminate-based phosphor in which O, Al, and at least one element M selected from the group consisting of Ca and Sr are activated by Eu and at least one element Q selected from the group consisting of Nd and Dy. Phosphor (5) for the first phosphor is preferably a boron-containing aluminate-based phosphor in which O, Al, B and at least one element M selected from the group consisting of Ca and Sr are activated by Eu and at least one element Q selected from the group consisting of Nd and Dy. The use of these phosphors for the first phosphor allows a bluish, bluish green, or greenish afterglow to be obtained.

When phosphor (9) is used for the second phosphor, a yellowish or reddish afterglow is obtained due to the second phosphor. The second phosphor emits light by at least partially converting the first emission spectrum. The emission of white light is possible by the mixture of these emissions. Since the second phosphor has a substantially stable energy conversion rate irrespective of the intensity of the first phosphor emission, the chromaticity of the emission in the white region does not change, and no color deviation is thereby likely to occur.

The addition of phosphor (7) to the first phosphor helps create an emission rich in a red hue.

Furthermore, the addition of phosphors (11) and/or (13) to the second phosphor helps create a white emission having excellent color rendering properties.

In particular, it is preferable that the first phosphor is a boron-containing aluminate-based phosphor wherein O, Al, B and at least one element M selected from the group consisting of Ca and Sr are activated by Eu and at least one element Q selected from the group consisting of Nd and Dy (a particularly preferable phosphor among phosphors (5)) and the second phosphor is phosphor (9). Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes.

Furthermore, it is preferable that the first phosphor contains a boron-containing aluminate-based phosphor wherein O, Al, B and at least one element M selected from the group consisting of Ca and Sr are activated by Eu and at least one element Q selected from the group consisting of Nd and Dy (a particularly preferable phosphor among phosphors (5)) and an aluminate-based phosphor wherein O, Al, and at least one element M selected from the group consisting of Ca and Sr are activated by Eu and at least one element Q selected from the group consisting of Nd and Dy (a particularly preferable phosphor among phosphors (3)), and the second phosphor is phosphor (9). Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes. Moreover, the afterglow luminosity is enhanced.

It is preferable that the first phosphor is an aluminate-based phosphor wherein O, Al, B and at least one element M selected from the group consisting of Ca and Sr are activated by Eu and at least one element Q selected from the group consisting of Nd and Dy (a particularly preferable phosphor among phosphors (5)). Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes. Moreover, the afterglow luminosity is enhanced.

(B) A combination of a phosphor represented by $(M_{1-a-b}Eu_aQ_b)O \cdot n(Al_2O_3)$ wherein M is at least one type selected from the group consisting of Mg, Ca, Ba, Sr and Zn; Q is at least one type selected from the group consisting of Pr, Nd, Dy, Er and Ho; a is a number that satisfies $0.0001 \leq a \leq 0.5$; b is a number that satisfies $0.0001 \leq b \leq 0.5$; and n is a number that satisfies $0.5 \leq n \leq 1.5$ (a preferable phosphor among phosphors (4)) for the first phosphor, and phosphor (10) for the second phosphor;

a combination of a phosphor represented by $(M_{1-a-b}Eu_aQ_b)O \cdot n(Al_{1-m}B_m)_2O_3$ wherein M is at least one type selected from the group consisting of Mg, Ca, Ba, Sr and Zn; Q is at least one type selected from the group consisting of Pr, Nd, Dy, Er and Ho; a is a number that satisfies $0.0001 \leq a \leq 0.5$; b is a number that satisfies $0.0001 \leq b \leq 0.5$; n is a number that satisfies $0.5 \leq n \leq 1.5$; and m is a number that satisfies $0 < m \leq 0.5$ (a preferable phosphor among phosphor (6)) for the first phosphor, and phosphor (10) for the second phosphor; and a combination of a phosphor represented by $(M_{1-a-b}Eu_aQ_b)O \cdot n(Al_2O_3)$ wherein M is at least one type selected from the group consisting of Mg, Ca, Ba, Sr and Zn; Q is at least one type selected from the group consisting of Pr, Nd, Dy, Er and Ho; a is a number that satisfies $0.0001 \leq a \leq 0.5$; b is a number that satisfies $0.0001 \leq b \leq 0.5$; and n is a number that satisfies $0.5 \leq n \leq 1.5$ (a preferable phosphor among phosphor (4)), and a phosphor represented by $(M_{1-a-b}Eu_aQ_b)O \cdot n(Al_{1-m}B_m)_2O_3$ wherein M is at least one type selected from the group consisting of Mg, Ca, Ba, Sr and Zn; Q is at least one type selected from the group consisting of Pr, Nd, Dy, Er and Ho; a is a number that satisfies $0.0001 \leq a \leq 0.5$; b is a number that satisfies $0.0001 \leq b \leq 0.5$; n is a number that satisfies $0.5 \leq n \leq 1.5$; m is a number that satisfies $0 < m \leq 0.5$ (a preferable phosphor among phosphor (6)) for the first phosphor, and phosphor (10) for the second phosphor.

Such combinations allow fluorescent materials with a high-luminosity afterglow across a significantly broad chromatic range to be more efficiently obtained. In particular, such combinations allow fluorescent materials to efficiently produce emissions in the white region, and enhance the water resistance and heat resistance.

Among the preferable phosphors of phosphors (4), those represented by $(M_{1-a-b}Eu_aQ_b)O \cdot n(Al_2O_3)$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; and n is a number that satisfies $0.5 \leq n \leq 1.5$ are particularly preferable. Furthermore, among the preferable phosphors of phosphors (6), those represented by $(M_{1-a-b}Eu_aQ_b)O \cdot n(Al_{1-m}B_m)_2O_3$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; n is a number that satisfies $0.5 \leq n \leq 1.5$; and m is a number that satisfies $0 < m \leq 0.5$ are particularly preferable. The use of these phosphors for the first phosphor allows a bluish, bluish green, or greenish afterglow to be obtained.

It is preferable that a phosphor represented by $(M_{1-a-b}Eu_aQ_b)O \cdot n(Al_{1-m}B_m)_2O_3$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; n is a number that satisfies $0.5 \leq n \leq 1.5$; and m is a number that satisfies $0 < m \leq 0.5$ (a particularly preferable phosphor among phosphors (6)) is used for the first phosphor, and a phosphor represented by $(Y_zGd_{1-z})_3Al_5O_{12}:Ce$ wherein z is a number that satisfies $0 < z \leq 1$ or $(A_{1-a}Sm_a)_3A'_5O_{12}:Ce$ wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) is used for the second phosphor. Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes.

It is more preferable that a phosphor represented by $(M_{1-a-b}Eu_aQ_b)O \cdot n(Al_{1-m}B_m)_2O_3$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; n is a number that satisfies $0.5 \leq n \leq 1.5$; and m is a number that satisfies $0 \leq m \leq 0.5$ (a particularly preferable phosphor among phosphors (6)) and a phosphor represented by $(M_{1-a-b}Eu_aQ_b)O \cdot n(Al_2O_3)$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; and n is a number that satisfies $0.5 \leq n \leq 1.5$ (a particularly preferable phosphor among phosphors (4)) are used for the first phosphor, and a phosphor represented by $(Y_zGd_{1-z})_3Al_5O_{12}:Ce$ wherein z is a number that satisfies $0 < z \leq 1$ or $(A_{1-a}Sm_a)_3A'_5O_{12}:Ce$ wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) is used for the second phosphor. Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes. Moreover, the afterglow luminosity is enhanced.

It is preferable that a phosphor represented by $(M_{1-a-b}Eu_aQ_b)O \cdot n(Al_2O_3)$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; and n is a number that satisfies $0.5 \leq n \leq 1.5$ (a particularly preferable phosphor among phosphors (4)) is used for the first phosphor, and a phosphor represented by $(Y_zGd_{1-z})_3Al_5O_{12}:Ce$ wherein z is a number that satisfies $0 < z \leq 1$ or $(A_{1-a}Sm_a)_3A'_5O_{12}:Ce$ wherein A is at least one type selected from the group consisting of Y, Gd, La and Sc; A' is at least one type selected from the group consisting of Al, Ga and In; and a is a number that satisfies $0 \leq a < 1$ (a particularly preferable phosphor among phosphors (10)) is used for the second phosphor. Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes. Moreover, the afterglow luminosity is enhanced.

When phosphor (10) is used for the second phosphor, a yellowish or reddish afterglow is obtained due to the second phosphor. The second phosphor emits light by at least partially converting the first emission spectrum. The emission of white light is possible by the mixture of these emissions. Since the second phosphor has a substantially stable energy conversion rate irrespective of the intensity of the first phosphor emission, the chromaticity of the emission in the white region does not change, and no color deviation is thereby likely to occur.

Phosphor (10) for the second phosphor, since it has a garnet structure, is resistant to heat, light and moisture, and therefore, the peak of the excitation spectrum thereof can be controlled to be near 450 nm. Having a peak of its emission spectrum near 580 nm, phosphor (10) has a broad emission spectrum extending as high as 700 nm.

When this phosphor contains Gd in its crystal structure, the luminous efficiency in relation to an excitation light having a wavelength in the long-wavelength region of 460 nm or greater can be enhanced. Due to the increase in the Gd content, the peak of the emission spectrum of the second phosphor shifts toward the long-wavelength region, and the overall emission spectrum shifts toward the long-wavelength region accordingly. In other words, when emissions rich in a red hue are desired, the amount of Gd should be increased. Accordingly, as the amount of Gd is increased, the contribution of blue light to the luminosity of the emission of this phosphor tends to decrease. If desired, in addition to Ce, other activators such as Tb, Cu, Ag, Au, Fe, Cr, Nd, Dy, Co, Ni, Ti, Eu, etc., can be used.

With respect to yttrium/aluminum/garnet-based phosphors having a garnet structure, the emission spectrum thereof shifts toward the short-wavelength region by substituting a portion of Al with Ga. In contrast, the emission spectrum thereof shifts toward the long-wavelength region by substituting a portion of Y with Gd.

When a portion of Y is substituted with Gd, it is preferable that the proportion of Gd is 20% or less, preferably 10% or less, and the proportion of Ce (extent of substitution) is preferably 0.03 to 1 per substrate. Although the proportion of substituting Gd within the aforementioned range enhances a green hue and reduces a red hue, a red hue can be augmented by increasing the amount of Ce, thereby allowing the desired hue to be obtained without impairing the luminosity. Such a construction enhances temperature properties.

The addition of phosphor (8) to the first phosphor helps create an emission rich in a red hue.

Moreover, the addition of phosphor (12) and/or phosphor (14) to the second phosphor helps create an emission in the white region having superior color rendering properties.

(C) A combination of phosphor (4) for the first phosphor and a phosphor represented by $(Y_zGd_{1-z})_3Al_5O_{12}:Ce$ wherein z is a number that satisfies $0 < z \leq 1$ or $(A_{1-a}Sm_a)_3A'_5O_{12}:Ce$ wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) for the second phosphor;

a combination of phosphor (6) for the first phosphor and a phosphor represented by $(Y_zGd_{1-z})_3Al_5O_{12}:Ce$ wherein z is a number that satisfies $0 < z \leq 1$ or $(A_{1-a}Sm_a)_3A'_5O_{12}:Ce$ wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) for the second phosphor; and a combination of phosphors (4) and (6) for the first phosphor and a phosphor represented by $(Y_zGd_{1-z})_3Al_5O_{12}$:Ce wherein z is a number that satisfies $0 < z \leq 1$ or $(A_{1-a}Sm_a)_3A'_5O_{12}$:Ce wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) for the second phosphor.

Such combinations allow fluorescent materials with a high-luminosity afterglow across a significantly broad chromatic range to be more efficiently obtained. In particular, such combinations allow fluorescent materials to efficiently produce emissions in the white region, and enhance the water resistance and heat resistance.

Phosphor (4) used for the first phosphor is preferably a phosphor represented by $(M_{1-a-b}Eu_aQ_b)O \cdot n(Al_2O_3)$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; and n is a number that satisfies $1.5 \leq n \leq 3$. Phosphor (6) used for the first phosphor is preferably a phosphor represented by $(M_{1-a-b}Eu_aQ_b)O \cdot n(Al_{1-m}B_m)_2O_3$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; n is a number that satisfies $1.5 \leq n \leq 3$; and m is a number that satisfies $0 < m \leq 0.5$. The use of these phosphors for the first phosphor allows a bluish, bluish green, or greenish afterglow to be obtained.

It is more preferable that a phosphor represented by $(M_{1-a-b}Eu_aQ_b)O \cdot n(Al_{1-m}B_m)_2O_3$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; n is a number that satisfies $1.5 \leq n \leq 3$; and m is a number that satisfies $0 < m \leq 0.5$ (a preferable phosphor among phosphors (6)) is used for the first phosphor, and a phosphor represented by $(Y_zGd_{1-z})_3Al_5O_{12}$:Ce wherein z is a number that satisfies $0 < z \leq 1$ or $(A_{1-a}Sm_a)_3A'_5O_{12}$:Ce wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) is used for the second phosphor. Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes.

It is preferable that a phosphor represented by $(M_{1-a-b}Eu_aQ_b)O \cdot n(Al_{1-m}B_m)_2O_3$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; n is a number that satisfies $1.5 \leq n \leq 3$; and m is a number that satisfies $0 < m \leq 0.5$ (a preferable phosphor among phosphors (6)) and a phosphor represented by $(M_{1-a-b}Eu_aQ_b)O \cdot n(Al_2O_3)$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; and n is a number that satisfies $1.5 \leq n \leq 3$ (a preferable phosphor among phosphors (4)) are used for the first phosphor, and a phosphor represented by $(Y_zGd_{1-z})_3Al_5O_{12}$:Ce wherein z is a number that satisfies $0 < z \leq 1$ or $(A_{1-a}Sm_a)_3A'_5O_{12}$:Ce wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) is used for the second phosphor. Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes. Moreover, the afterglow luminosity is enhanced.

It is preferable that a phosphor represented by $(M_{1-a-b}Eu_aQ_b)O \cdot n(Al_2O_3)$ wherein M is at least one type selected from the group consisting of Ca and Sr; Q is at least one type selected from the group consisting of Nd and Dy; a is a number that satisfies $0.0001 \leq a \leq 0.5$; b is a number that satisfies $0.0001 \leq b \leq 0.5$; and n is a number that satisfies $1.5 \leq n \leq 3$ (a preferable phosphor among phosphors (4)) is used for the first phosphor, and a phosphor represented by $(Y_zGd_{1-z})_3Al_5O_{12}$:Ce wherein z is a number that satisfies $0 < z \leq 1$ or $(A_{1-a}Sm_a)_3A'_5O_{12}$:Ce wherein A is at least one type selected from the group consisting of Y, Gd, La and Sc; A' is at least one type selected from the group consisting of Al, Ga and In; and a is a number that satisfies $0 \leq a < 1$ (a preferable phosphor among phosphors (10)) is used for the second phosphor. Such a construction allows, without impairing the effects of the invention, the heat of the first phosphor to be absorbed by the second phosphor, thereby reducing changes in the afterglow luminosity caused by temperature changes and significantly reducing changes in the emission color caused by temperature changes. Moreover, the afterglow luminosity is enhanced.

When the second phosphor is a preferable mode among the aforementioned phosphors (10), a yellowish or reddish afterglow is obtained due to the second phosphor. The second phosphor emits light by at least partially converting the first emission spectrum. The emission of white light is possible by the mixture of these emissions. Since the second phosphor has a substantially stable energy conversion rate irrespective of the intensity of the first phosphor emission, the chromaticity of the emission in the white region does not change, and no color deviation is thereby likely to occur.

The addition of phosphor (8) to the first phosphor helps create an emission rich in a red hue.

Moreover, the addition of phosphor (12) and/or phosphor (14) to the second phosphor helps create an emission in the white region having superior color rendering properties.

Other Components and Proportions Thereof

The first phosphor of the present invention may further contain aluminum oxide, silicon oxide, tantalum oxide, and like whitish oxides, thereby imparting a white body color to the fluorescent material of the invention.

Furthermore, the second phosphor of the invention may further contain aluminum oxide, silicon oxide, tantalum oxide, and like whitish oxides, thereby imparting a white body color to the fluorescent material of the invention.

In the fluorescent material of the invention, the proportion of first phosphor to second phosphor can be suitably selected according to the desired emission chromaticity and afterglow properties. In both situations in which the first phosphor and the second phosphor are mixed, or the first phosphor and the second phosphor are disposed in the form of separate layers, for example, about 0.1 to about 5 parts by weight of the second phosphor is used per part by weight of the first phosphor.

Production Method

Methods for producing the fluorescent material of the invention are not limited, and examples thereof are described in (1) to (5) below:

(1) Preparation of a Starting Mixture for the First Phosphor

A starting mixture for the first phosphor is produced by mixing compounds which will be described below such that each constituent element is contained therein in a specific proportion. Compounds used in the starting mixture for the first phosphor are selected according to the elements that constitute the desired construction.

Mixing methods are not limited, for example, mixing powdery compounds just as they are to form the starting mixture; mixing the compounds in the form of a slurry using water and/or organic solvents and drying the slurry to form the starting mixture; mixing aqueous solutions of the compounds for precipitation and drying the precipitate to form the starting mixture; and using these methods in combination.

Compounds that are usable in the starting mixture for the first phosphor are given below.

(For Sulfide-Based Phosphors)

Compounds of Mg, Ca, Ba, Sr, Zn, Cd, Cu, Mn, Eu, Cl, Ag, and S are not limited. Examples are those that can readily form sulfides by reaction with S, such as metals, oxides, etc.

(For Aluminate-Based Phosphors)

Compounds of Mg, Ca, Ba, Sr, Zn, Eu, Pr, Nd, Dy, Er, Ho, and B are not limited. Examples are oxides and compounds that can readily form oxides at high temperatures.

(For Oxysulfide-Based Phosphors)

Compounds of Y, La, Gd, Lu, Eu, Mg, Ti, Nb, Ta, and Ga are not limited. Examples are those that can readily form oxysulfides by reaction with S, such as oxides, carbonates, etc.

(2) Calcination and Pulverization of the Starting Mixture for the First Phosphor The starting mixture is then calcined. Temperature, time, atmosphere, and other conditions for calcination are not limited, and can be selected according to the type of fluorescent material.

The calcination temperature is preferably 800° C. or higher. Excessively low calcination temperatures may allow unreacted ingredients to remain in the first phosphor, thereby likely impairing the properties of the first phosphor. The aforementioned calcination temperatures do not result in such a problem. The calcination temperature is preferably no higher than 1600° C. Excessively high calcination temperatures make the diameter of the first phosphor particles too large, thereby likely impairing the properties of the first phosphor. The aforementioned calcination temperatures do not result in such a problem.

The preferable calcination time is usually about 1 to about 20 hours. When the calcination time is too short, the diffusional reaction among starting particles barely proceeds. When the calcination time is too long, the calcination that continues after the near-completion of the diffusional reaction brings no benefits, and it may result in creating coarse particles. Calcination times in the aforementioned range do not result in such problems.

Examples of calcination atmospheres are atmospheric air; oxygen gas; a mixed gas composed of such a gas and an inert gas like nitrogen gas, argon gas, etc.; an atmosphere in which the oxygen concentration (oxygen partial pressure) is controlled; a weakly oxidizing atmosphere; a reducing atmosphere; etc. A reducing atmosphere herein refers to a nitrogen atmosphere, a hydrogen atmosphere, a nitrogen-hydrogen atmosphere, an ammonia atmosphere, an argon or other inert gas atmosphere, etc. In particular, $H_2$, $N_2$, and like reducing atmospheres are preferable.

If desired, the starting mixture after calcination may be pulverized using a stone mill, ball mill, vibration mill, pin mill, jet mill or the like to create a powder of the desired particle size. The starting mixture may be sieved.

The first phosphor of the invention can be obtained according to the preparation method described above.

(3) Preparation of the Starting Mixture for the Second Phosphor

The starting mixture for the second phosphor is produced by mixing compounds which will be described below such that each constituent element is contained therein in a specific proportion. Compounds used in the starting mixture for the second phosphor are selected according to the elements that constitute the desired construction.

Mixing methods are as described above in connection with the first phosphor.

Compounds usable in the starting mixture for the second phosphor are given below.

(For Cerium-Activated Yttrium Aluminum Oxide-Based Phosphors)

Compounds of Y, Lu, Sc, La, Gd, Pr, Tb, Sm, Al, Tl, Ga, and In are not limited. Examples are oxides and compounds that can readily form oxides at high temperatures.

(For Nitride-Based Phosphors and Oxynitride-Based Phosphors)

Compounds of Be, Mg, Ca, Sr, Ba, Zn, C, Si, Ge, Sn, Ti, Zr, Hf, N, Y, La, Ce, Pr, Nd, Sm, Eu, Gd, Tb, Dy, Ho, Er, and Lu are not limited. Examples are metals, nitrides, oxides, and compounds that can readily form nitrides or oxynitrides at high temperatures.

(For Silicate-Based Phosphors)

Compounds of Be, Mg, Ca, Sr, Ba, Zn, Eu, and Si are not limited. Examples are oxides and compounds that can readily form oxides at high temperatures.

(4) Calcination and Pulverization of the Starting Mixture for the Second Phosphor The calcination and pulverization of the starting mixture are as described above in connection with the first phosphor.

In case at least one phosphor selected from phosphors (17) to (29) is to be used in the second phosphor, they can be produced as described below. With respect to phosphor (17) for example, a specific amount of phosphate oxide which constitutes the aforementioned alkaline earth metal halogen apatite phosphor, specific amounts of compounds that can form oxides due to thermal decomposition, and a specific amount of ammonium chloride are measured; and these ingredients are mixed in a ball mill; placed in a crucible in a reducing atmosphere of $N_2$, $H_2$, or the like; and calcined at about 800 to 1200° C. for about 3 to about 7 hours. The calcined product thus obtained is then wet-pulverized, sieved, dehydrated, and dried, thereby giving an alkaline earth metal halogen apatite phosphor. Other phosphors can be produced in a similar manner by mixing in a specific proportion compounds containing constituent elements and calcining the mixture.

(5) Mixing of the First Phosphor and the Second Phosphor

When used in small amounts, the first phosphor and the second phosphor can be mixed by hand in a plastic bag or can be mixed by placing them into a container, such as a plastic bottle, and rotating the container on a roller.

When used in large amounts, the first phosphor and the second phosphor can be mixed by a mixer, such as a double cone mixer, super mixer, or the like.

The fluorescent material of the invention can be obtained according to the preparation method described above.

Applications of the Fluorescent Material of the Invention

Applications of the fluorescent material of the invention are not limited. The fluorescent material of the invention can be applied to, for example, the lamp and light-emitting device of the invention which will be described below, displays, coatings, guidance lights, clock faces, shades for fluorescent lamps, stickers, earthenware, toys, fibers, resin articles, glass products, switches, materials for road pavement, building materials, artificial inorganic fluorescent marine reinforcements, artificial inorganic ceramics, etc.

Examples of product applications of the fluorescent material of the present invention are described below.

(a) Decorative items having a phosphor layer containing the fluorescent material of the present invention formed on the surface of a substrate and a transparent covering layer on the surface of the phosphor layer.

Such decorative items can give a luxurious feel to the phosphor layer of apparatuses and clocks/watches and keep the phosphor layer from deteriorating.

The covering layer herein is preferably of a synthetic resin having a rigidity of 2H pencil lead or higher. Use of a synthetic resin enables the covering layer to be readily formed, and the rigidity of 2H pencil lead or higher permits effective polishing, thereby allowing it to be easily flattened, smoothed, mirror-finished, and patterned.

Such decorative items can be produced according to a method having the steps of applying to the surface of a substrate a mixture containing the fluorescent material of the invention in the form of a powder and an organic binder, forming a phosphor layer by curing the mixture, forming a covering layer by applying a transparent resin to the surface of the phosphor layer and curing it, and conditioning the surface of the covering layer.

(b) Display items having a substrate equipped with a display surface and a display layer that is disposed on the surface of the substrate and contains the fluorescent material of the invention.

Due to such a construction, display items, display units, metering devices, watches and clocks having enhanced expressiveness and gorgeousness can be produced.

The display layer may contain, in addition to the fluorescent material of the invention, coloring pigments that give off colors under visible light. The substances usually used as coatings can be used herein as coloring pigments.

(c) Paints containing at least the fluorescent material of the invention and a lead-free frit.

A lead-free frit preferably contains at least MgO and CaO in an MgO proportion of about 0.1 to about 5 wt. % and in a CaO proportion of no more than 5 wt. %. Such a paint preferably contains the fluorescent material of the invention in a proportion of about 1 to about 100 parts by weight based on 100 parts by weight of lead-free frit.

Pictures painted with such a paint and baked onto ceramic products emit an afterglow in a desired color, thereby enabling beautifully decorated ceramic products to be produced.

Such a paint can be obtained by mixing a lead-free frit with an inorganic pigment if necessary, finely pulverizing the mixture using a magnetic pot mill or the like, adding the fluorescent material of the invention at the end to give a powdery paint, and mixing the powdery paint thus obtained with a binder and a solvent. Mixing it with the binder is performed using a grinder or the like such that the powder is uniformly suspended. The proportion of the binder is about 1 to about 50 parts by weight based on 100 parts by weight of solids content.

(d) Lamps. Lamps in which the fluorescent material of the present invention is used are described below.

(II) Lamps

A lamp of the present invention is equipped with a light-emitting body that converts electric energy into light energy and a translucent glass that covers the light-emitting body. A phosphor layer is disposed on at least the inner or outer surface of the translucent glass, and the phosphor layer contains the fluorescent material of the invention.

The light-emitting body to excite the fluorescent material of the invention is not limited, and known light-emitting items can be used therefor. Those usable for the light-emitting body are, for example, incandescent lamps, fluorescent lamps, HID lamps, halogen lamps, etc.

The fluorescent material contained in the phosphor layer of the lamp of the present invention is the fluorescent material of the present invention described above. The type of phosphor, preferable range, production method, and other factors of the fluorescent material are as described above.

With respect to the lamp of the invention, the thickness of the phosphor layer to be created is in the range of about 5 to about 100 µm although it varies depending on the particle diameter of the phosphors used. With the thickness being within the aforementioned range, the fluorescent material of the invention is securely contained in the phosphor layer, and the afterglow thereby obtained is sufficient for practical use. Moreover, emissions from the light-emitting body (lamp) are barely interrupted by the phosphor layer, and the primary function thereof as an illumination lamp can thereby be sufficiently maintained.

With respect to fluorescent lamps in general, the fluorescent material in the phosphor layer provided on the inner surface of a glass tube is excited by ultraviolet radiation, thereby producing emissions. Therefore, it is also possible to directly use ultraviolet. When applied to the inner surface of a glass tube, the fluorescent material of the invention is directly excited by a 253.7-nm mercury line irradiated from a positive column, which is the light-emitting body of a fluorescent lamp, thereby allowing the fluorescent lamp to produce an afterglow of high luminosity across a very broad chromatic range and to maintain a consistent afterglow chromaticity for a long period of time.

In the lamp of the present invention, the phosphor layer preferably contains the fluorescent material of the present invention and at least one type of 3-wavelength fluorescent material composed of a blue-light-emitting phosphor having its peak emission wavelength near 450 nm, a green-light-emitting phosphor having its peak emission wavelength near 545 nm and a red-light-emitting phosphor having its peak emission wavelength near 610 nm.

In such a case, the lamp of the present invention has high luminosity and can serve as a fluorescent lamp for illumination purposes by emitting light in the white region, and the color of its emission can be altered as desired. The lamp exhibits afterglow properties across a very broad chromatic range, and can maintain a substantially consistent afterglow for a long period of time.

$(SrCaBaMg)_5(PO_4)_3Cl:Eu$ and $BaMgAl_{10}O_{17}:Eu$ are preferable as blue-light-emitting phosphors. $LaPO_4:Ce,Tb$ and $MgAl_{11}O_{19}:Ce,Tb$ are preferable as green-light-emitting phosphors. $Y_2O_3:Eu$ is preferable as a red-light-emitting phosphor.

In the phosphor layer of the lamp of the invention, a phosphor for illumination capable of exciting the fluorescent material may be used, in addition to the fluorescent material of the invention. In such a case, it is sufficient that the fluorescent material of the invention and a phosphor for illumination that excites the fluorescent material take the form of an admixture in the phosphor layer. Moreover, the lamp of the invention may contain the fluorescent material of the invention and a phosphor for illumination in separate layers. The lamp of the invention is preferably furnished with an illuminative phosphor and designed to emit white light.

A wide variety of known illuminative phosphors can be used herein for the aforementioned illuminative phosphor without limitation, for example, $(SrCaBaMg)_5(PO_4)_3Cl:Eu$, $BaMg_2Al_{16}O_{27}:Eu$, $Sr_5(PO_4)_3Cl:Eu$, $LaPO_4:Ce,Tb$, $MgAl_{11}O_{19}:Ce,Tb$, $Y_2O_3:Eu$, $Y(PV)O_4:Eu$, $3.5MgO.0.5MgF_2.GeO_2:Mn$, $Ca_{10}(PO_4)_6FCl:Sb,Mn$, $Sr_{10}(PO_4)_6FCl:Sb,Mn$, $(SrMg)_2P_2O_7:Eu$, $Sr_2P_2O_7:Eu$, $CaWO_4$, $CaWO_4:Pb$, $MgWO_4$, $(BaCa)_5(PO_4)_3Cl:Eu$, $Sr_4Al_{14}O_{25}:Eu$, $Zn_2SiO_4:Mn$, $BaSi_2O_5:Pb$, $SrB_4O_7:Eu$, $(CaZn)_3(PO_4)_2:Tl$, $LaPO_4:Ce$, $BaMgAl_{10}O_{17}:Eu$, $BaMg_2Al_{16}O_{27}:Eu,Mn$, $BaMgAl_{10}O_{17}:Eu,Mn$, etc.

With respect to the fluorescent lamp of the invention, the proportion of the fluorescent material of the invention to the concomitant illuminative phosphor contained in the phosphor layer can be suitably selected according to the application. The illuminative phosphor is usually used in a proportion of about 0.1 to 5 parts by weight per part by weight of the fluorescent material of the invention. When the primary purpose of the lamp is for illumination, i.e., when high luminous flux is desired, the illuminative phosphor is used in a large proportion. When a relatively strong afterglow is desired, the proportion of the fluorescent material of the invention is increased.

In the production of the lamp of the invention, a protective film made of alumina or the like may be formed over the translucent glass, and the phosphor layer is created thereon, thereby improving emission properties, such as the luminous flux and lumen maintenance factor.

The luminous flux of the afterglow of the lamp of the invention due to the fluorescent material is preferably no less than 0.05 lumen and no less than 0.005 lumen 1 minute and 10 minutes after turning off a 30-W power supply, respectively, thereby allowing the lamp to produce an afterglow of high luminosity across a very broad chromatic range.

Methods for producing the lamp of the invention are not limited, and include the following:

(1) Preparation of Fluorescent Material

The fluorescent material can be obtained according to the method described in connection with the fluorescent material of the invention.

Methods for producing an illuminative phosphor which is for use in combination with the fluorescent material of the invention are well known.

(2) Preparation of a Fluorescent Material Coating Suspension

The aforementioned fluorescent material and a binder, such as alumina, calcium pyrophosphate, calcium barium borate or the like, are added to a nitrocellulose/butyl acetate solution and mixed therein to yield a fluorescent material coating suspension.

(3) Preparation of Lamps

The fluorescent material coating suspension as obtained above is poured into a glass tube and this is followed by usual procedures, such as warm-air drying, baking, ventilation, filament mounting, cap installation, etc., to produce the lamp of the invention.

FIG. 1 shows a sectional schematic view of a lamp which is one embodiment of the invention. In this lamp, the fluorescent material of the invention is applied to the inner surface (inner phosphor layer 3) and outer surface (outer phosphor layer 4) of translucent glass 2 wrapped around light-emitting body 1 of the lamp. Phosphor layer 6 is disposed on a surface of reflector plate 5 for this lamp, thereby giving afterglow properties to the reflector plate. In another embodiment, the lamp of the invention may be equipped with either inner phosphor layer 3 or outer phosphor layer 4.

In the embodiment described herein, the inner phosphor layer 3 and the outer phosphor layer 4 contain the first phosphor and the second phosphor in combination.

Figure 2:
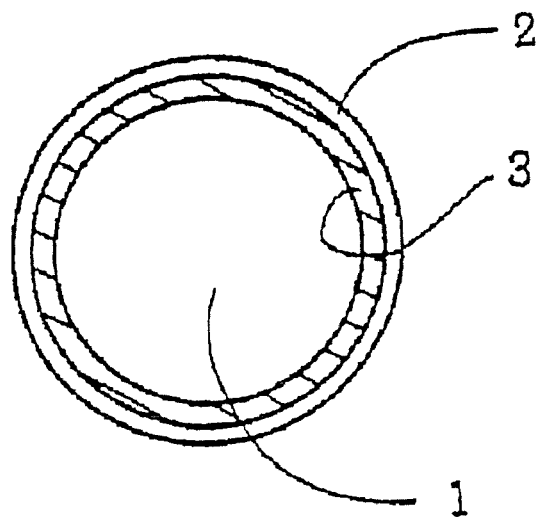
FIG. 2 is a sectional view of a lamp in another embodiment of the invention.

Next, the lamp of the invention is described by reference to a sectional view perpendicular to the longitudinal direction of the tube. FIG. 2 is a sectional view of a lamp which is another embodiment of the present invention created perpendicular to the longitudinal direction of the tube. This lamp has light-emitting body 1 and translucent glass 2 that is disposed around the light-emitting body 1. Inside the glass 2, inner phosphor layer 3 is provided. The first phosphor and the second phosphor are contained in the inner phosphor layer 3 as a mixture. In this lamp, light energy (ultraviolet radiation in this case) converted from electric energy by the positive column, i.e., the light-emitting body, mostly excites the phosphor layer 3 formed on the inner surface of the translucent glass 2.

Figure 3:
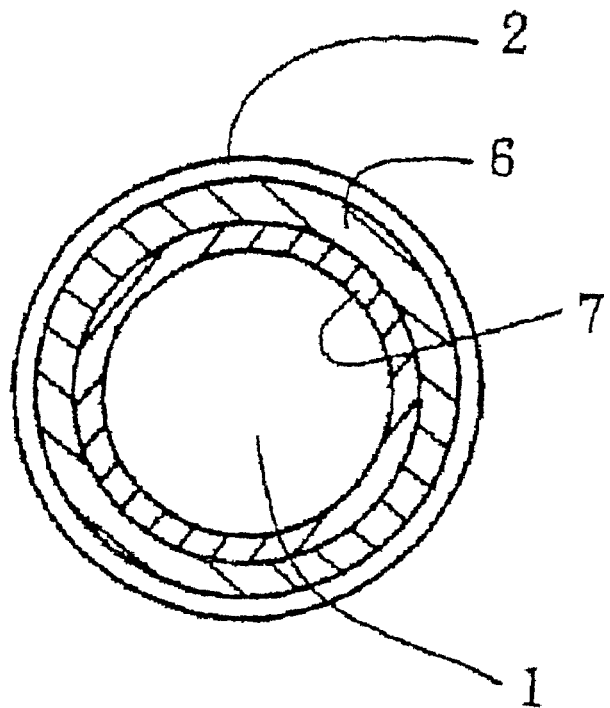
FIG. 3 is a sectional view of a lamp in yet another embodiment of the invention.

FIG. 3 is a sectional view of a lamp of yet another embodiment of the invention created perpendicular to the longitudinal direction of the tube. In this lamp, the first layer in contact with the inner surface of translucent glass 2 is phosphor layer 6, and the second layer in contact with the inner surface of the first layer is illuminative phosphor layer 7. In this construction, the 253.7 nm mercury line of light-emitting body 1 is almost completely used to excite the illuminative phosphor layer 7. The phosphor layer 6 is excited by visible light emitted by the illuminative phosphor layer 7. This lamp has high luminosity for illumination purposes, and the afterglow thereof is also of high luminosity.

Figure 4:
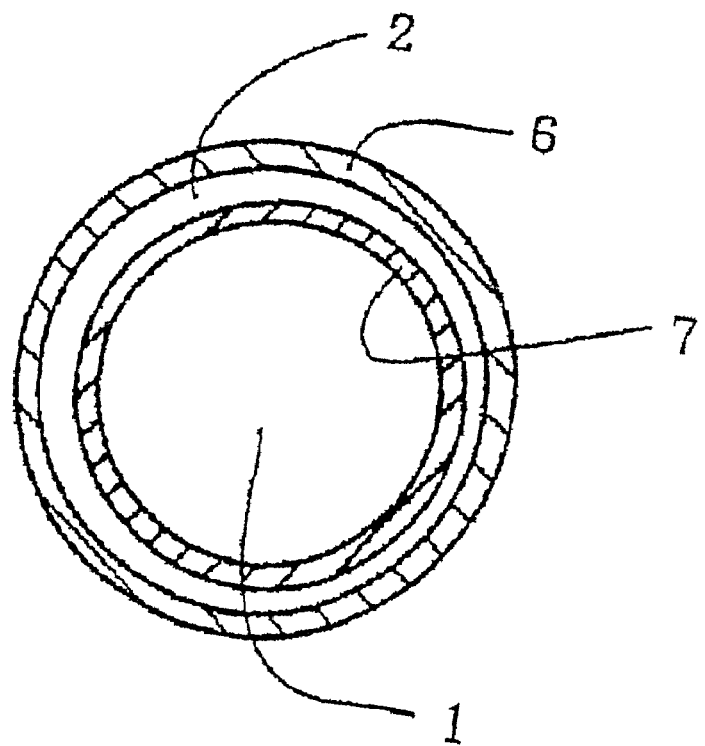
FIG. 4 is a sectional view of a lamp in still another embodiment of the invention.

FIG. 4 is a sectional view of a lamp of yet another embodiment of the invention created perpendicular to the longitudinal direction of the tube. In this lamp, illuminative phosphor layer 7 is disposed on the inner surface of translucent glass 2, and phosphor layer 6 is disposed on the outer surface of translucent glass 2. In a lamp having this layered structure also, the mercury line of light-emitting body 1 is almost completely used to excite the illuminative phosphor layer 7. The phosphor layer 6 is excited by visible light emitted by the illuminative phosphor layer 7.

(III) Light-Emitting Devices

Fundamental Construction

The light-emitting device of the present invention comprises an LED chip and a fluorescent material that at least partially converts the energy emitted by the LED chip. This fluorescent material is the aforementioned fluorescent material of the invention. The mixed-color emission created by the emission spectrum of the first phosphor and the emission spectrum of the second phosphor is whitish.

The second phosphor is composed of ingredients having an emission spectrum of the longer-wavelength region than the first phosphor. The second phosphor is thereby efficiently excited by the emission of the light-storing first phosphor.

With respect to the light-emitting device of the invention, when electricity is supplied, a mixed-color light is emitted due to the emission spectra of the LED chip, the first phosphor and the second phosphor. Moreover, since the first phosphor is of a light-storing nature, the first emission spectrum is continuously irradiated due to the light stored by the first phosphor even when no electricity is supplied. The second phosphor is therefore excited by the emission of the first phosphor and emits light in return. In this manner, mixed-color light can be emitted due to the first and second phosphors even when no electricity is supplied. With respect to the light-emitting device of the invention, the mixed-color light emitted due to the first and second phosphors when no power is supplied is white. Moreover, this afterglow can be conditioned to have a white hue similar to that obtained when power is supplied.

In the light-emitting device of the invention having such a construction, used in combination are an LED chip that can be made small, that consumes little power and that produces a highly luminous emission and a fluorescent material composed of two kinds of phosphors, i.e., the light-storing first phosphor and the second phosphor. The light-emitting device thereby can emit light having a desired hue in the white range, and its power consumption can be further reduced by supplying electricity intermittently.

Light-emitting devices equipped with the fluorescent material of the invention are described below by reference to drawings, but the scope of the present invention is not limited to these embodiments.

Figure 5:
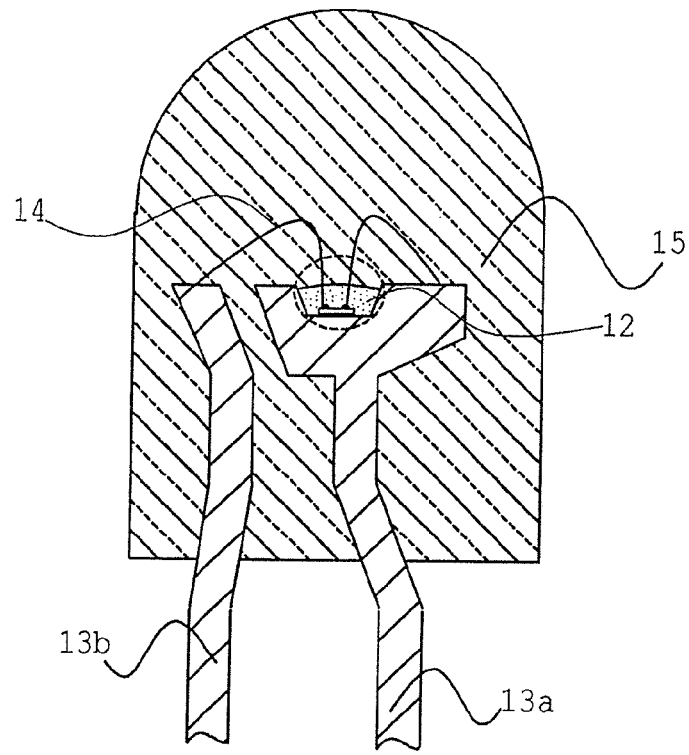
FIG. 5 includes a diagram (a) showing a sectional view of a light-emitting device in an embodiment of the invention and a diagram (b) showing an enlarged sectional view showing a principal portion of the light-emitting device shown in the diagram (a).
Figure 5:
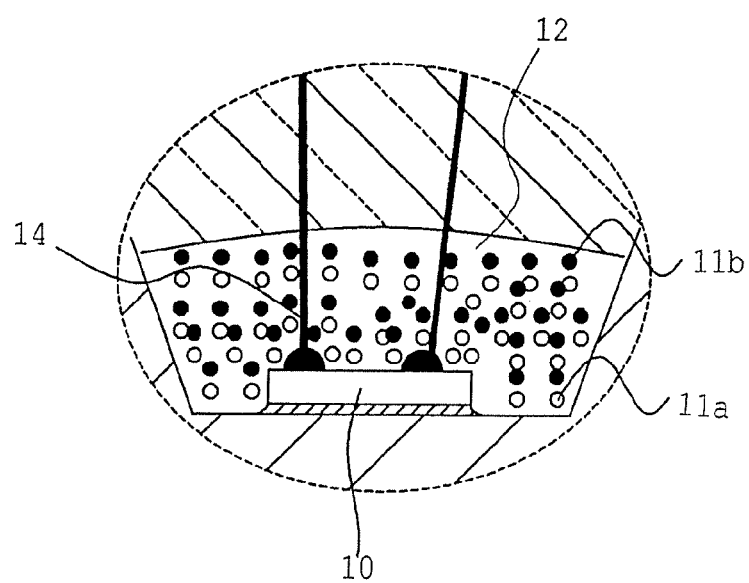

FIG. 5 is a schematic drawing of a light-emitting device which is one embodiment of the present invention. FIG. 5($b$) is a drawing in which the principal portion of the light-emitting device shown in FIG. 5($a$) is enlarged. This light-emitting device contains a light-emitting element (LED chip) 10 composed of a semiconductor layer laminated on the upper surface of a sapphire substrate; lead frames 13$a$ and 13$b$ electrically connected by conductive wires 14 extending from the positive and negative electrodes formed on the same plane as the semiconductor layer; phosphors 11$a$ and 11$b$ disposed in the cup of lead frames 13$a$ and 13$b$ such that the light-emitting element, which is composed of the sapphire substrate and the semiconductor layer, is encapsulated; coating material 12; and molded item 15 covering the phosphors and the exterior portion of the lead frames.

The semiconductor layer of the light-emitting element is furnished with a light-emitting layer (not shown). The light emitted by this light-emitting layer has an emission spectrum of about 360 to 580 nm. Such an LED chip is placed in a die-bonder, and die-bonded (adhered) to the lead frame equipped with a cup by face-up bonding. After die-bonding, the lead frame is transferred to a wire bonder, and the negative electrode of the LED chip is wire-bonded to the cup-disposed lead frame by a gold wire, and the positive electrode is wire-bonded to the other lead frame. The lead frames are then transferred into a molding device. Using the dispenser of the molding device, the coating material containing the first phosphor 11$a$ and the second phosphor 11$b$ is introduced into the cup created in the lead frame. Phosphors 11$a$ and 11$b$ in the coating material are uniformly mixed beforehand in a desired proportion. The coating material containing the phosphors is poured into the cup of the lead frame, and the lead frames are dipped into a mold in which a resin that is to become the molded item has been poured. The resin is then removed from the mold and cured, thereby giving a lamp-type light-emitting device as shown in FIG. 5($a$). Phosphors 11$a$ and 11$b$ can also be used as a mixture in the molded item without the use of the coating material. However, as described above, by having the light-storing first phosphor 11$a$ and the second phosphor 11$b$ in the coating material, color conversion efficiently proceeds when power is supplied, thereby creating a mixed-color emission having excellent color rendering properties. Moreover, even when no power is supplied, i.e., after the termination of the power supply, the color of the emitted light can be substantially the same as that obtained when the power is supplied.

With respect to the light-emitting device of the invention, a method for mixing the first phosphor and the second phosphor, and a method for creating a phosphor layer and the position thereof can be suitably selected in consideration of the desired emission color and the configuration of the light-emitting device, and are therefore not limited to those described herein.

The constituents of the light-emitting device of the invention are described below.

Fluorescent Materials

Fluorescent materials usable in the light-emitting device of the invention are as described with respect to the fluorescent material of the invention.

Noteworthy, but not limiting, characteristics of the fluorescent material used in the light-emitting device include the fact that stilbene-based dyes, oxazole-based dyes, cyanine-based dyes, xanthene-based dyes, oxazine-based dyes, acridine-based dyes, eoxine-based dyes, anthracene derivatives, naphthacene derivatives, pentacene derivatives, pyrene derivatives, perylene derivative, coumarin derivatives, rhodamine derivatives, DCM derivatives, europium complex, phenyl pyridine iridium complex, and like organic (fluorescent) pigments are usable for the second phosphor. Such organic phosphors have a relatively high wavelength conversion efficiency and good dispersion, thereby allowing the fluorescent material to be uniformly contained and resulting in a uniform light emission having enhanced luminosity. The aforementioned inorganic phosphors maintain sufficient photoresisting properties even when the energy emitted by the LED chip is intensified. Therefore, they are unlikely to be degraded when used in conjunction with, for example, high-output LED chips or LED chips having their emission spectrum in the ultraviolet region. For the second phosphor of the invention, either inorganic or organic phosphors may be used singly, or such phosphors can be used in combination. The type of phosphor can be suitably selected according to the application and usage environment of the light-emitting device.

For example, if an organic phosphor that has a relatively poor photoresistance is to be used as the second phosphor, such a phosphor is applied to the light-emitting device by accommodating the phosphor in a cap member that contains an elastic translucent material such as a silicone rubber or a urethane rubber tailored according to the outer shape of a molded item as shown in FIG. 5($a$), and installing the cap member to a light-emitting diode, thereby positioning the phosphor as far away from the light source as possible.

Preferable combinations of the first phosphor and the second phosphor are combinations (A) to (C) that were previously described.

For example, with respect to combination (A), if phosphor (9) is used for the second phosphor, due to phosphor (5) being used for the first phosphor, i.e., a boron-containing aluminate-based phosphor having its peak emission wavelength in the range of 430 to 530 nm and phosphor (9) having its peak emission wavelength in the range of 500 to 590 nm, a white emission can be realized by using it in combination with an LED composed of a gallium nitride-based compound semiconductor that gives an emission in the wavelength range of 360 to 580 nm.

LED Chip

LED chip 10 materials are not limited. The LED chip 10 is preferably a light-emitting element composed of a Group III nitride-based compound semiconductor, such as a gallium nitride-based compound semiconductor. The construction of the light-emitting element is described below in detail.

The LED chip used herein has a layered structure in which an n-type semiconductor layer, an active layer, and a p-type semiconductor layer are formed on a substrate in this order. A portion of the LED chip is etched such that the n-type layer is exposed, and an n-electrode is formed on the exposed n-type layer. A p-electrode is formed on the uppermost p-type layer. The p-electrode is equipped with a wire-bonding p-pad used for external connection, thereby forming a pad electrode.

The substrate is not limited insofar as a nitride semiconductor can be epitaxially grown thereon. The size, thickness and other particulars of the substrate are not limited. Examples of the substrate are insulating substrates such as sapphire or spinel ($MgAl_2O_4$) having either the C, R or A plane as the principal plane; silicon carbide (6H, 4H, 3C); silicon; ZnS; ZnO; Si; GaAs; diamond; and oxide substrates such as lithium niobate, neodymium gallate and the like whose lattice matches with nitride semiconductors. Moreover, nitride semiconductor substrates such as GaN, AlN and the like are usable insofar as they have a thickness that allows device processing (several tens of nanometers or greater).

The nitride semiconductor has a general formula of $In_xAl_yGa_{1-x-y}N$ ($0 \leq x$, $0 \leq y$, $x+y \leq 1$), and may form a mixed crystal with B, P, or As. Moreover, the n-type nitride semiconductor layer and the p-type nitride semiconductor layer may be single- or multi-layered. If desired, n- or p-type impurities can be suitably contained in the nitride semiconductor layer. Group IV and Group VI elements such as Si, Ge, Sn, S, O, Ti, Zr, etc., can be used as n-type impurities. Si, Ge and Sn are preferably used, with Si being particularly preferable. Examples of p-type impurities are Be, Zn, Mn, Cr, Mg, Ca, etc., although they are not limited to these. Mg is preferable. Nitride semiconductors of a desired conductivity type can be thereby formed. A nitride semiconductor has an active layer having a single quantum well (SQW) or multi-quantum well (MQW) structure.

A nitride semiconductor is grown on the substrate with a buffer layer provided in-between. A nitride semiconductor represented by the general formula $Al_aGa_{1-a}N$ ($0 \leq a \leq 0.8$), and particularly preferably $Al_aGa_{1-a}N$ ($0 \leq a \leq 0.5$), is used for the buffer layer. The thickness of the buffer layer is preferably about 0.002 to about 0.5 μm, more preferably about 0.005 to about 0.2 μm, and even more preferably about 0.01 to about 0.02 μm. The temperature for growing the buffer layer is preferably about 200 to about 900° C., and more preferably about 400 to about 800° C., thereby reducing dislocations and pits in the nitride semiconductor. Moreover, a layer of $Al_xGa_{1-x}N$ ($0 \leq X \leq 1$) may be formed on a different material substrate according to the epitaxial lateral overgrowth (ELO) method. The ELO method reduces dislocations by growing a nitride semiconductor in the transverse direction to bend threading dislocations for convergence. The buffer layer may have a multi-layered structure and contain a low-temperature-deposited buffer layer and a high-temperature-deposited buffer layer formed thereon. Undoped GaN or GaN doped with an n-type impurity can be used for the high-temperature-grown layer. The thickness of the high-temperature-grown layer is usually at least 1 μm, and preferably at least 3 μm. The temperature for growing the high-temperature-deposited buffer layer is about 900 to about 1100° C., and preferably at least about 1050° C.

An n-type semiconductor layer is then grown. An n-type contact layer is grown first. For an n-type contact layer, $Al_jGa_{1-j}N$ ($0<j<0.3$) is preferable because it has a construction that creates a greater band gap energy than the active layer. The thickness of the n-type contact layer is not limited, and it is preferably at least about 1 μm, and more preferably at least about 3 μm. An n-type cladding layer is then formed. The n-type cladding layer contains Al. The concentration of the n-type impurity is not limited, and it is preferably about $1 \times 10^{17}$ to about $1 \times 10^{20}/cm^3$, and more preferably about $1 \times 10^{18}$ to about $1 \times 10^{19}/cm^3$. The cladding layer may have an n-type impurity concentration gradient. Due to the concentration gradient in the Al composition, the cladding layer attains confinement of carriers function.

The active layer has a quantum well structure containing at least a well layer composed of $Al_aIn_bGa_{1-a-b}N$ ($0 \leq a \leq 1$, $0 \leq b \leq 1$, $a+b \leq 1$) and a barrier layer composed of $Al_cIn_dGa_{1-c-d}N$ ($0 \leq c \leq 1$, $0 \leq d \leq 1$, $c+d \leq 1$). Although nitride semiconductors usable for the active layer may be undoped, n-type impurity doped, or p-type impurity doped, they are preferably undoped or n-type impurity doped, thereby enhancing the output of the light-emitting element. More preferably, by not doping the well layer and doping the barrier layer with an n-type impurity, the output and emission efficiency of the light-emitting element can be enhanced. Furthermore, due to the presence of Al in the well layer used for the light-emitting element, emissions in the wavelength region that has hardly been obtained by conventional InGaN well layers, i.e., the band gap energy of GaN with a wavelength of about 365 nm or smaller, can be obtained.

The thickness of the well layer is preferably 1 nm to 30 nm, more preferably 2 nm to 20 nm, and even more preferably 3.5 nm to 20 nm. The thickness within the range of about 1 to 30 nm assures good function in the well layer, provides sufficient crystallinity of the quaternary mixed crystals of InAlGaN, and makes the properties of the light-emitting element sufficient for practical use. With a thickness of 2 nm or greater, the resulting well layer attains a relatively uniform film quality without creating significantly uneven film thickness, and with a thickness of no more than 20 nm, the occurrence of crystal defects can be reduced, allowing crystal growth. A thickness of 3.5 nm or greater can enhance the output. The thickened well layer promotes radiative recombination due to its high emission efficiency and internal quantum efficiency in relation to a large carrier injection, as in LDs driven by a large current, and the thickened wall layer is particularly effective for MQW structures. In an SQW structure, a thickness of no less than 5 nm has the effect of enhancing the output as described above. The number of well layers is not limited. When the number of well layers is four or more, the thickness of the well layer should be no more than 10 nm to keep the thickness of the active layer small. An excessively large thickness in each layer constituting the active layer results in a large thickness of the entire active layer and an increase in Vf. In an MQW structure, it is preferable to have at least one of the aforementioned well layers having a thickness of no more than 10 nm, and it is more preferable that all of the well layers have a thickness of no more than 10 nm.

As with the well layer, the barrier layer is preferably doped with a p-type or n-type impurity or undoped, and more preferably doped with an n-type impurity or undoped. When the barrier layer is doped with an n-type impurity, the concentration of the n-type impurity needs to be at least $5\times10^{16}/cm^3$. For example, a concentration of $5\times10^{16}/cm^3$ to $2\times10^{18}/cm^3$ is preferable for LEDs.

A concentration of $5\times10^{17}/cm^3$ to $1\times10^{20}/cm^3$, and more preferably $1\times10^{18}/cm^3$ to $5\times10^{19}/cm^3$, is preferable for high-output LEDs and LDs. In such a case, the well layer is preferably grown undoped or without substantial doping with an n-type impurity. When barrier layers are doped with an n-type impurity, all of the barrier layers in the active layer may be doped, while some barrier layers may be doped and the other barrier layers may be left undoped. When some barrier layers are doped with an n-type impurity, it is preferable to dope barrier layers formed on the n-type layer side in the active layer. For example, by doping the nth barrier layer Bn (n is a positive integer) as counted from the n-type layer side, electrons can be efficiently injected into the active layer, thereby enabling a light-emitting element having superior emission efficiency and internal quantum efficiency to be obtained. With respect to the well layers, by doping the mth well layer Wm (m is a positive integer) as counted from the n-type layer side, the effects as described in connection with the doping of barrier layers can be obtained. The effects described above can be obtained even when both barrier layers and well layers are doped.

Next, as described below, a plurality of layers are formed on the active layer as p-type nitride semiconductor layers. P-type cladding layers are not limited insofar as they have a construction creating a greater band gap energy than the active layer, and they can confine carriers in the active layer. A usable example is $Al_kGa_{1-k}N$ ($0\leq k<1$), with $Al_kGa_{1-k}N$ ($0<k<0.4$) being preferable. The thickness of the p-type cladding layer is not limited, and it is preferably about 0.01 to about 0.3 µm, and more preferably about 0.04 to about 0.2 µm. The concentration of the p-type impurity in the p-type cladding layer is preferably about $1\times10^{18}$ to about $1\times10^{21}/cm^3$, and more preferably about $1\times10^{19}$ to about $1\times10^{20}/cm^3$. A concentration of the p-type impurity within the aforementioned ranges allows the bulk resistance to be lowered without impairing crystallinity. The p-type cladding layer may be single- or multi-layered (superstructure). When multi-layered, it is sufficient that the cladding layer be a multilayered film composed of the aforementioned $Al_kGa_{1-k}N$ and a nitride semiconductor layer having a band gap energy smaller than that of the $Al_kGa_{1-k}N$. Examples of layers having a small band gap energy are, as with the n-type cladding layer, $In_lGa_{1-l}N$ ($0\leq l<1$) and $Al_mGa_{1-m}N$ ($0\leq m<1$, m>l). With respect to layers constituting a multilayered structure, in the case of a superstructure, the thickness of one layer is preferably no more than 100 Å, more preferably no more than 70 Å, and even more preferably about 10 to 40 Å. When the p-type cladding layer has a multilayered structure containing a layer having a large band gap energy and a layer having a small band gap energy, at least a layer having a large band gap energy or a layer having a small band gap energy is doped with a p-type impurity. When both a layer having a large band gap energy and a layer having a small band gap energy may be doped, the amount of doping may be the same or different.

A p-type contact layer is then formed on the p-type cladding layer. $Al_fGa_{1-f}N$ ($0\leq f<1$) is used for the p-type contact layer. In particular, forming the p-type contact layer by $Al_fGa_{1-f}N$ ($0\leq f<0.3$) enables a good ohmic contact with the second electrode (p-electrode) which is the ohmic electrode.

The concentration of the p-type impurity is preferably at least $1\times10^{17}/cm^3$. The p-type contact layer preferably has a concentration gradient in which the proportion of p-type impurity is high and the proportion of Al in the mixed crystal is low on the side of the conductive substrate. In such a case, the concentration gradient may be gradual or stepwise. For example, the p-type contact layer can be designed to have a first contact layer that contacts the ohmic electrode and has a high concentration of p-type impurity and a small proportion of Al, and a second p-type contact layer having a low concentration of p-type impurity and a large proportion of Al, thereby preventing self-absorption due to the first p-type contact layer.

In this manner, a nitride semiconductor is grown on a substrate. The wafer is then removed from the reactor and subjected to heat treatment at a temperature of 450° C. or higher in an atmosphere containing oxygen and/or nitrogen, thereby removing hydrogen that is bonded to the p-type layer and forming a p-type nitride semiconductor layer that exhibits p-type conductivity.

A p-electrode that provides an ohmic contact is then formed on the surface of the aforementioned p-type contact layer. Examples of methods for forming a p-electrode are CVD, sputtering, vapor deposition, and like methods. The efficiency of light extraction can be enhanced by designing the p-electrode to take a rectangular, streaked, squared, latticed, dotted, rhombus, parallelogram, meshed, striped, branched (in which one sprays into several), comb-like, circular, or like form.

Moreover, the p-electrode is an ohmic electrode for passing an electric current through the light-emitting element by means of an ohmic contact with the p-type layer at the surface of the p-type nitride semiconductor layer. Usually, in a nitride semiconductor, in addition to the ohmic p-electrode, for example, a p-pad electrode that is used for wire-bonding is formed, and the ohmic electrode, i.e., the p-electrode, is electrically connected with the p-pad electrode. The p-pad electrode may be disposed on the p-side layer, or it can be disposed external to the p-side layer via metal wiring, for example, it can be disposed on the plane on which the n-side electrode is formed, with an insulation film provided in-between. When a p-pad electrode is formed on the p-side layer, the p-pad electrode may be designed such that a portion of the p-electrode overlaps with the p-pad electrode, or the p-pad electrode may be formed on the p-electrode. When light is obtained from the side on which the p-pad electrode has been formed, the p-pad electrode needs to be formed as small as possible.

An n-electrode is formed on the surface of the n-contact layer. With respect to the n-electrode, a pad electrode for bonding and an ohmic electrode that is in contact with the n-side layer by an ohmic contact can be simultaneously formed in substantially the same shape. An ohmic electrode and an n-pad electrode can be laminated in layers, or an ohmic n-electrode can be formed in a shape and by a process different from those for an n-pad electrode and then laminated.

Once the electrodes are formed on the surface of the nitride semiconductor layer, they are subjected to heat treatment. The electrodes are thereby alloyed and exhibit a good ohmic contact with the semiconductor layer. Moreover, the contact resistance between the semiconductor layer and the electrodes can be thereby lowered. The heat treatment temperature is preferably about 200 to about 1200° C., more preferably about 300 to about 900° C., and even more preferably about 450 to about 650° C.

Next, a light-emitting element having an emission spectrum in the ultraviolet region near 356 nm is described. Due to the use of such a light-emitting element having its emission spectrum in the ultraviolet region, the emission efficiency of the first and second phosphors can be enhanced since the first phosphor in particular can be efficiently excited. That is, a light-emitting device having reduced power consumption and high luminosity can be provided.

On a sapphire substrate having the C plane as its principal plane, a nitride semiconductor substrate in which two plane orientations match in the c axis direction, in particular an AlN layer in which the plane orientations match in the c axis direction, is formed, and the upper surface thereof is a mirror surface. On the AlN layer, a GaN layer is grown that has a greater lattice constant than the AlN layer. A nitride semiconductor layer is laminated on the layered semiconductor substrate composed of such a sapphire substrate, an AlN layer and a GaN layer, thereby forming an LED. Next, described below is a process in which an AlN layer, a GaN layer, and a nitride semiconductor layer provided on top are successively grown in a single apparatus.

First, the first semiconductor layer is described. A sapphire substrate is placed in the reaction chamber of an MOCVD apparatus, and the temperature is increased to at least 1000° C., preferably up to 1200° C. During heating, nitrogen ($N_2$) and/or hydrogen ($H_2$) is introduced as a carrier gas. At a temperature of 1100° C. or greater, or preferably once the temperature has reached 1200° C., at least ammonia ($NH_3$) gas and a material gas are supplied. In this stage, the amount of $NH_3$ supplied is about 0.0005 to about 0.01 mol, and preferably about 0.0008 to about 0.008 mol. The amount of material gas, for example, TMA (trimethylaluminum), supplied is about 0.1 to about 10 µmol, and preferably about 0.5 to about 5 µmol. At this stage, the V/III ratio is about 50 to about 100,000, and the pressure is about 50 to 100 torr. Grown for at least three hours under the aforementioned conditions, an AlN film is formed in a thickness of about 0.2 to about 3 µm. When Ga is contained in the AlN film, the surface of the AlN film can be readily made specular. In particular, during the growth of the AlN film, the supply of TMG (trimethylgallium) in an amount of about 0.1 to about 10 µmol gives AlGaN. Ga is preferably contained in the AlN film in a proportion of about 0.1 to about 2%.

Next, the second semiconductor layer is described. As the first step, $NH_3$ is supplied in an amount of about 0.0005 to about 0.05 mol, and TMG is supplied in an amount of about 30 to about 100 µmol. At this stage, the V/III ratio is about 5 to about 1650, and the pressure is about 700 to about 850 torr. Grown for at least 5 minutes under the aforementioned conditions, a 3-dimensional GaN grown nucleus having a thickness of about 0.05 to about 0.3 µm is grown. As the second step, $NH_3$ is supplied in an amount of about 0.005 to about 0.3 mol, and TMG is supplied in an amount of about 20 to about 200 µmol. At this stage, the V/III ratio is about 2.5 to about 15,000, and the pressure is about 700 to about 850 torr. Grown for at least 0.5 hour under the aforementioned conditions, a low-dislocation GaN film is grown in a thickness of about 1 to about 10 µm.

It is preferable to alter the temperatures, pressures, and V/III ratios in the first and second steps so as to select the conditions optimum for 3-dimensional nucleation and planarization. For example, by selecting, at the initial stage of crystal growth, the conditions that yield a low-density 3-dimensional nucleus, the dislocation density created during nuclear fusion can be kept low, and tilting during nuclear fusion can be inhibited due to the low c-axis orientation of the nucleus. In other words, the GaN layer inherits the c-axis characteristics of the AlN layer, but due to the relaxed crystalline condition in the a-axis direction, the GaN layer thus formed has less edge dislocations and/or screw dislocations than the AlN layer.

Next, the nitride semiconductor layer is described. First, an n-type contact layer is formed on the GaN layer. For an n-type contact layer, $Al_jGa_{1-j}N$ (0<j<0.3) is preferable because it has a construction that creates a greater band gap energy than the active layer, which will be described below. The thickness of the n-type contact layer is not limited, and it is preferably about 1 µm or greater, and more preferably about 3 µm or greater. The concentration of the n-type impurity in the n-type contact layer is not limited, and it is preferably about $1 \times 10^{18}$ to about $1 \times 10^{20}/cm^3$, and more preferably about $5 \times 10^{18}$ to about $5 \times 10^{19}/cm^3$. The n-type contact layer may have an n-type impurity concentration gradient. Due to the concentration gradient in the Al composition, the n-type contact layer attains a carrier confinement function.

A light-emitting layer (active layer) is then formed. The active layer has a quantum well structure containing at least a well layer composed of $Al_aIn_bGa_{1-a-b}N$ (0≦a≦1, 0≦b≦1, a+b≦1) and a barrier layer composed of $Al_cIn_dGa_{1-c-d}N$ (0≦c≦1, 0≦d≦1, c+d≦1). The thickness of the well layer is preferably 1 nm to 30 nm, more preferably 2 nm to 20 nm, and even more preferably 3.5 nm to 20 nm. The number of well layers is not limited, and the thickness of the entire active layer is preferably determined in consideration of the minority carrier diffusion length. As with the well layer, the barrier layer is preferably doped with a p-type impurity or n-type impurity, or is undoped. When the barrier layer is doped with an n-type impurity, the concentration of the n-type impurity needs to be at least $5 \times 10^{16}/cm^3$. For example, a concentration of $5 \times 10^{16}/cm^3$ to $1 \times 10^{20}/cm^3$ is preferable for LEDs. In such a construction, a nitride semiconductor having a band gap energy greater than that of the well layer needs to be used for the barrier layer. In particular, when the emission wavelength of the well layer is in the region of 380 nm or smaller, it is preferable to use 4-component mixed crystals of AlInGaN represented by the general formula $Al_cIn_dGa_{1-c-d}N$ (0≦c<1, 0<d≦1, c+d<1) or 3-component mixed crystals of AlGaN for the barrier layer.

Next, a plurality of p-type nitride semiconductor layers are formed on the active layer. P-type cladding layers are not limited insofar as they have a construction having a greater band gap energy than the active layer, and they can confine carriers in the active layer. A usable example is $Al_kGa_{1-k}N$ (0≦k<1), with $Al_kGa_{1-k}N$ (0<k<0.4) being preferable. The thickness of the p-type cladding layer is not limited, and it is preferably about 0.005 to about 0.3 µm, and more preferably about 0.01 to about 0.2 µm. The concentration of the p-type impurity in the p-type cladding layer is preferably about $1 \times 10^{18}$ to about $1 \times 10^{21}/cm^3$, and more preferably about $1 \times 10^{19}$ to about $5 \times 10^{20}/cm^3$. The concentration of the p-type impurity within the aforementioned ranges allows the bulk resistance to be lowered without impairing crystallinity. The p-type cladding layer may be single- or multi-layered (superstructure). When multi-layered, it is sufficient that the cladding layer is a multilayered film composed of the aforementioned $Al_kGa_{1-k}N$ (0≦k<1) and a nitride semiconductor layer having a band gap energy smaller than that of the $Al_kGa_{1-k}N$. Examples of layers having a small band gap energy are, as with the n-type cladding layer, $In_lGa_{1-l}N$ (0≦l≦1) and $Al_mGa_{1-m}N$ (0≦m<1, m>1). With respect to layers constituting a multilayered structure, in the case of a superstructure, the thickness of each layer is preferably no more than 10 nm, more preferably no more than 7 nm, and even more preferably about 1 to 4 nm. When the cladding layer has a multilayered structure containing a layer having a large band gap energy and a layer having a small band gap energy, at least a layer having a large band gap energy or a layer having a small band gap energy is doped with an impurity. When both a layer having a large band gap energy and a layer having a small band gap energy are doped, the amount of doping may be the same or different.

A p-type contact layer is then formed on the p-type cladding layer. $Al_fGa_{1-f}N$ ($0 \leq f<1$) is used for the p-type contact layer. In particular, forming the p-type contact layer by $Al_fGa_{1-f}N$ ($0 \leq f<0.3$) enables a good ohmic contact with a p-electrode, i.e., the ohmic electrode, which is formed later. The concentration of the p-type impurity in the p-type contact layer is preferably at least $1 \times 10^{18}/cm^3$. Thereafter, part of the p-type contact layer, p-type cladding layer, active layer, and n-type contact layer are removed by etching, thereby exposing a portion of the n-type contact layer. An n-electrode is formed on the exposed surface to create an LED. The nitride semiconductor layer can be formed according to, in addition to the metalorganic chemical vapor deposition (MOCVD), the halide vapor phase epitaxy (HVPE) method, the molecular beam epitaxy (MBE) method, etc.

Light-emitting elements having the construction disclosed in the publication given below are usable herein for the light-emitting element having its emission spectrum in the ultra-violet region: light-emitting elements produced using a layered semiconductor substrate by reference to the construction disclosed in Daisuke Morita et. al., "High Output Power 365 nm ULTRAVIOLET Light Emitting Diode of GaN-Free Structure" J. Appl. Phys., Vol. 41, (2002), pp. 1434-1436.

As in the process described above, first, an AlN layer and a GaN layer are grown on a sapphire substrate, and the layers described below are grown thereon one after another. First, an n-type $Al_{0.07}Ga_{0.93}N$ layer is formed in a thickness of about 2.5 μm, with Si being the n-type impurity. An active layer is then formed that has an MQW structure consisting of five pairs of a well layer and a barrier layer (MQW active layer). The well layers in this case contain undoped $In_{0.01}Ga_{0.99}N$ and have a thickness of about 5 nm. The barrier layers contain Si—$Al_{0.09}Ga_{0.91}N$ and have a thickness of about 20 nm. A p-type $Al_{0.38}Ga_{0.62}N$ layer is then formed in a thickness of about 30 nm. The p-type impurity herein is Mg. A p-type ohmic contact electrode is formed by vapor deposition. In this stage, Rh is used so as to give the p-type ohmic contact electrode good reflection properties, thereby enabling a high reflectivity at the border shared with the p-type AlGaN layer to be obtained in response to emissions having a wavelength of 365 nm. Thereafter, an Au/Sn film is thinly formed on the p-type ohmic contact electrode.

The p-type ohmic contact electrode side is bonded to a substrate having a high thermal conductivity (e.g., a CuW substrate) with an Au/Sn film being provided in-between. The sapphire substrate, AlN layer, and GaN layer are then removed by laser irradiation from the back side of the sapphire substrate to expose the n-type $Al_{0.07}Ga_{0.93}N$ layer. After polishing the exposed surface of the n-type $Al_{0.07}Ga_{0.93}N$ layer by, for example, chemical mechanical polishing (CMP), an n-type electrode is formed on the polished surface in the form of, for example, a specific mesh. The CuW substrate is then mounted on a lead frame having a low thermal resistance.

Due to the construction of the light-emitting element produced according to such a process, the CuW substrate has good heat dissipation, resulting in enhanced light-output.

Light-emitting elements usable in the present invention are not limited to those that have the emission wavelength obtained due to the aforementioned semiconductor construction. Light-emitting elements having different constructions can be also used herein insofar their emission spectra are in the range of about 360 to about 580 nm.

Coating Material

Coating material 12, which functions as a wavelength-converting member, is provided in the cup of lead frame 13 and mixed for use with first phosphor 11a that converts the energy emitted by the LED chip 10 and the second phosphor 11b. Specific examples of materials for the coating material 12 are transparent resins having good temperature properties and weather resistance, such as epoxy resins, urea resins, and silicone resins; silica sols; glasses; inorganic binders; etc. The coating material may contain, in addition to the phosphors 11a and 11b, a diffusing agent, barium titanate, titanium oxide, aluminum oxide, etc. A light stabilizer and a coloring agent may also be used.

The concentration of the fluorescent material of the invention in the coating material can be suitably selected according to the application. Proportion of the fluorescent material to be used is usually about 0.05 to about 5 per the entire coating member containing the fluorescent material.

Lead Frame

Lead frame 13 is composed of mount lead 13a and inner lead 13b. Mount lead 13a is to accommodate LED chip 10. The upper portion of mount lead 13a has the shape of a cup. LED chip 10 is die-bonded in the cup, and the outer surface of LED chip 10 is covered with the aforementioned phosphors 11 and coating material 12. When a plurality of LED chips 10 are provided in the cup, mount lead 13a can be used as a common electrode for the LED chips 10. In such a case, sufficient electrical conductivity and connectability with conductive wire 14 are needed. Die-bonding (adhering) between LED chip 10 and the cup of mount lead 13a can be performed by taking advantage of a thermosetting resin. Examples of thermosetting resins are epoxy resins, acrylic resins, imide resins, etc. LED chip 10 is die-bonded to mount lead 13a by using facedown bonding and electrically connected using Ag paste, carbon paste, a metal bump, etc. Inorganic binders can also be used.

Inner lead 13b is electrically connected to conductive wire 14 extending from electrode 3 of LED chip 10 disposed on mount lead 13a. Inner lead 13b is preferably positioned distant from mount lead 13a to avoid short circuits due to electrical contact with mount lead 13a. When a plurality of LED chips 10 are provided on mount lead 13a, the light-emitting device must have a construction that does not allow conductive wires to contact each other. The materials for inner lead 13b are preferably the same as those of mount lead 13a, for example, iron, copper, copper-iron alloys, gold, platinum, silver, etc.

Conductive Wire

Conductive wire 14 serves to electrically connect electrode 3 of LED chip 10 and lead frame 13. Conductive wire 14 preferably has good ohmic properties, mechanical connectability, electrical conductivity, and thermal conductivity to the electrode. Specific examples of materials for conductive wire 14 are preferably metals such as gold, copper, platinum, aluminum, etc., and alloys thereof.

Molded Item

Molded item 15 is provided to protect LED chip 10, phosphors 11, coating material 12, lead frames 13, conductive wires 14, and the like from external stress. In addition to protection from external stress, molded item 15 has the functions of widening the viewing angle, reducing the directivity of LED chip 10, and converging or diffusing the light emission. The molded item can be shaped as desired to attain such functions. For example, molded item 15 may have the shape of a converging lens or a diverging lens or may have a layered construction. Specific examples of materials for molded item 15 are those that have excellent transparency, weather resistance and temperature properties, such as epoxy resins, urea resins, silicone resins, silica sols, and glasses. Molded item 15 may contain a diffusing agent, colorant, UV-absorber, and fluorescent material. Preferable examples of diffusing agents are barium titanate, titanium oxide, aluminum oxide, etc. In view of physical repulsion with coating material 12 and the refractive index, materials for molded item 15 are preferably the same as those used for coating material 12.

Figure 6:
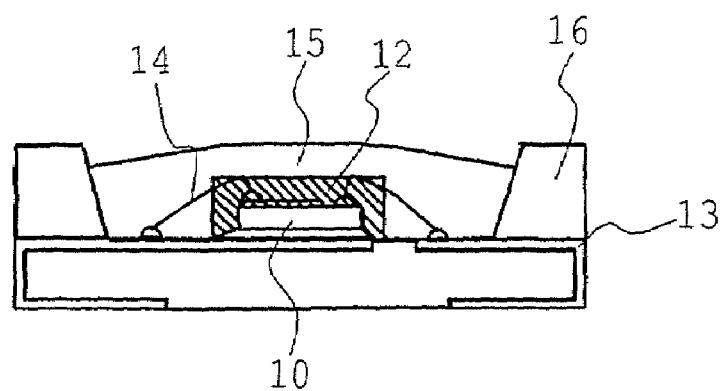
FIG. 6 is a sectional view of a light-emitting device in another embodiment of the invention.

Other embodiments of the invention, i.e., light-emitting devices, are described below. FIG. 6 is a sectional view of a light-emitting device of one embodiment of the invention. In this light-emitting device, LED chip 10 is mounted in the concave portion of package 16, in which lead frame 13 connected to the conductive wires 14 is provided, composed of a resin and the like; and a coating member (wavelength converting member) 12 is formed such that the light-emitting surface (upper surface) and the side surface of LED chip 10 are entirely covered thereby. Disconnection or displacement of the conductive wire can be prevented by forming coating member 12 with a soft resin having a relatively low thermal expansion coefficient, such as a silicone resin. The first phosphor and the second phosphor that are obtainable as described above are contained in coating member 12. A good mixed-color emission can be obtained especially when the ratio of the first phosphor to the second phosphor is about 70 to about 30 on a part by weight basis (first phosphor/second phosphor=about 30/70).

A gallium nitride-based compound semiconductor having an emission spectrum in the range of about 360 to about 580 nm is used for the LED chip. The concave portion of package 16 in which coating member 12 is provided is filled with molded item 15. When the thickness of coating member 12 applied to the light-emitting surface and to the side surface of LED chip 10 is the same, as shown in FIG. 6, the creation of irregular emissions can be prevented, thereby enabling a good light-emitting device to be produced.

Figure 7:
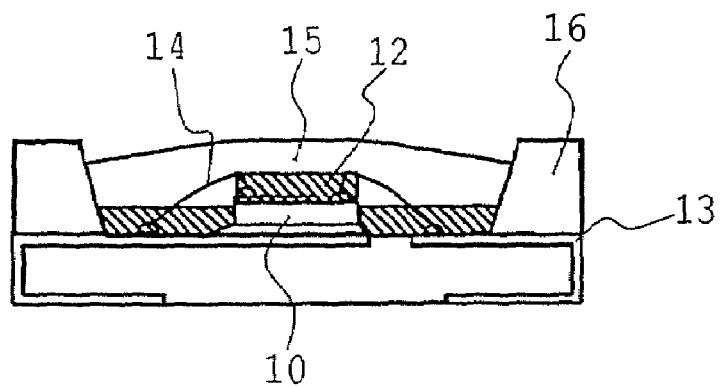
FIG. 7 is a sectional view of a light-emitting device in yet another embodiment of the invention.

FIG. 7 is a sectional view of a light-emitting device of yet another embodiment of the invention. Similarly to the light-emitting device shown in FIG. 6, LED chip 10 is mounted in the concave portion of package 16, in which lead frame 13 connected to the conductive wires 14 is provided. In this device, the thickness of phosphor-containing coating member 12 disposed on top of LED chip 10 may be approximately the same as the thickness of coating member 12 inside the concave portion provided at the proximity of LED chip 10, thereby minimizing the difference in the optical path lengths of the emissions by LED chip 10 and allowing uniform emissions to be created. Moreover, color irregularity at the light-emitting surface and color variations created by LEDs can be minimized.

Such coating member 12 may be two-layered in which the first phosphor is contained in one layer and the second phosphor in the other layer. In such a case, the coating member containing the first phosphor is placed such that it directly contacts LED chip 10, and the coating member containing the second phosphor is placed such that it covers the coating member containing the first phosphor, i.e., the coating member containing the second phosphor is positioned more toward the output direction of the emission than the coating member containing the first phosphor, thereby enhancing the wavelength conversion efficiency of the respective phosphors. Furthermore, in this way, by positioning the first phosphor, which is a light-storing phosphor, close to the light source (LED chip), and positioning the second phosphor toward the output direction of the emission as much as possible, degradation of the second phosphor can be prevented, thereby inhibiting color deviation without impairing the color balance.

Package 16 is preferably highly rigid and highly adhesive to coating member 12 and molded item 15. Furthermore, package 16 preferably has a low thermal expansion coefficient in consideration of the adhesion to molded item 15 since package 16 may receive heat from LED chip 10. The surface of the concave portion of package 16 may be embossed to increase contact area, or plasma-treated to enhance the adhesion to molded item 15. Package 16 may be formed integral with lead frame 13, or may have a construction such that package 16 is multi-pieced and assembled by fitting. Examples of materials for package 16 are polycarbonate resins, polyphenylene sulfide (PPS), liquid crystal polymers (LCP), ABS resins, epoxy resins, phenol resins, acrylic resins, imide resins, etc. Ag paste, ITO paste, a metal bump, and the like are preferably used to position and secure LED chip 10 by facedown mounting and electrically connect LED chip 10 with lead frame 13 contained in the package.

If materials for coating member 12 and molded item 15 that have not much difference in thermal expansion coefficient are selected, they can prevent the wire that connects the electrodes of the LED chip and lead frame 13 from being disconnected. Specific examples of materials for coating member 12 are translucent inorganic materials such as $SiO_2$, $Al_2O_3$, $MSiO_3$ (M is Zn, Ca, Mg, Ba, Sr, or the like), etc. In conjunction with the first and second phosphors, a UV-absorber and the like can be suitably used in coating member 12. Specific examples of materials for molded item 15 are glasses and transparent resins having excellent weather resistance, such as epoxy resins, urea resins, silicone resins, etc.

Figure 8:
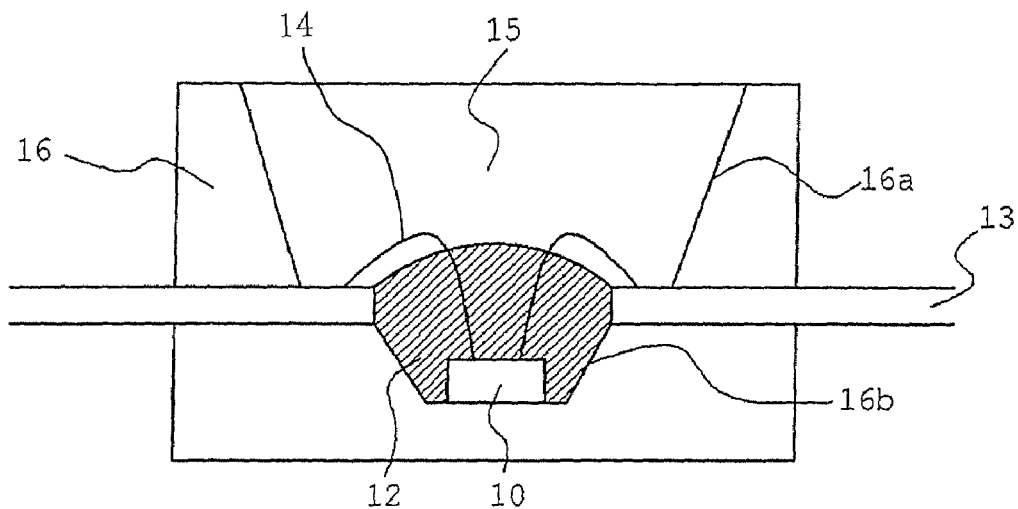
FIG. 8 is a sectional view of a light-emitting device in yet another embodiment of the invention.

FIG. 8 is a sectional view of a light-emitting device of yet another embodiment of the invention. In this device, at the bottom of concave portion 16a of package 16 (referred to as the first concave portion of this embodiment), the second concave portion 16b is created. Phosphor-containing coating material 12 can be readily installed into the device by filling the second concave portion with the coating material 12. The creation of the second concave portion 16b enables phosphor-containing coating material 12 to be uniformly disposed around LED chip 10 even when a material of relatively low viscosity is used. Package 16 is formed integral with lead frames 13. Portion of lead frames 13 is exposed to the bottom of the first concave portion 16a, and the second concave portion 16b is disposed between lead frames 13 and positioned at the center of the bottom surface of the first concave portion 16a. LED chip 10 is mounted in the second concave portion 16b with Ag paste being placed in-between, and an n-electrode and a p-electrode formed on top of the LED chip are connected to lead frames 13 via conductive wires 14. The molded item 15 is provided over the coating material 12 within the first concave portion 16a. Moreover, if lead frames 13 extend into the second concave portion, the LED chip can be mounted facedown in the second concave portion without using a bonding wire.

Figure 9:
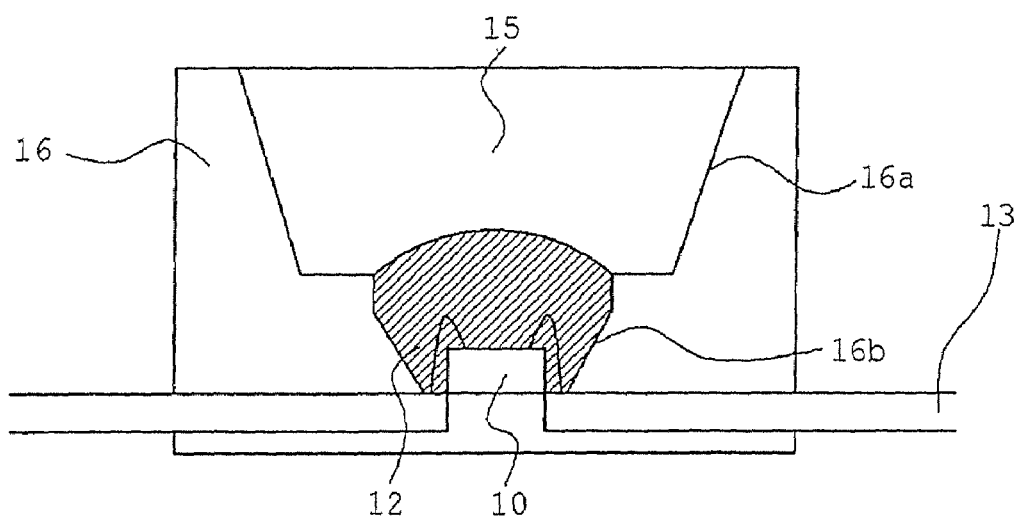
FIG. 9 is a sectional view of a light-emitting device in yet another embodiment of the invention.

FIG. 9 is a sectional view of a light-emitting device of yet another embodiment of the invention. Similarly to the light-emitting device shown in FIG. 8, in this device, at the bottom of the first concave portion 16a of the package 16, the second concave portion 16b is created. The molded item 15 is provided over the coating material 12 within the first concave portion 16a. In this device, lead frames 13 can be integrally formed such that lead frames 13 are exposed to the bottom of second concave portion 16b. The diameter of the second concave portion 16b can be suitably selected in consideration of the size of LED chip 10 and the depth of the second concave portion 16b. For example, by making the diameter narrow, the upper and side surface of LED chip 10 can be covered more uniformly. Moreover, if the second concave portion 16b contains inclined surface, light emissions by LED chip 10 can be reflected into the output direction, thereby enhancing the efficiency of light extraction. Such a construction allows the phosphors to be evenly arranged, thereby reducing color irregularity.

Figure 10:
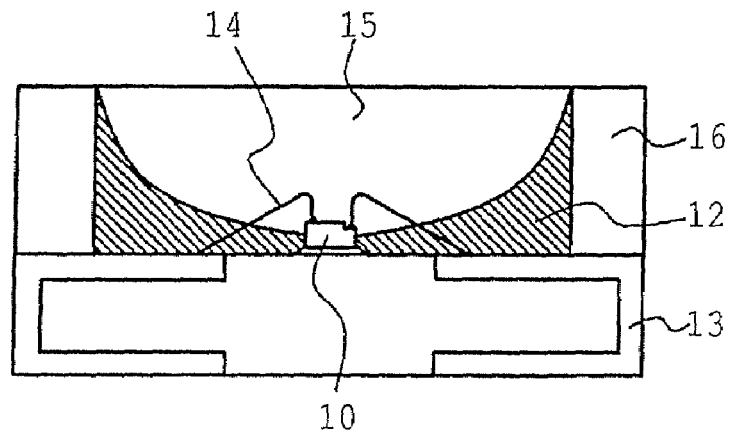
FIG. 10 is a sectional view of a light-emitting device in yet another embodiment of the invention.

FIG. 10 is a sectional view of a light-emitting device of yet another embodiment of the invention. In this device, wavelength converting member 12 composed of a translucent material containing the first and second phosphors is disposed in the form of a reflector within the package 16, thereby allowing efficient color conversion, and making this device a highly luminous light-emitting device. Phosphors prepared as described above are used for the first and second phosphors, and a gallium nitride-based compound semiconductor that emits light in the range of 360 to 580 nm is used for the LED chip 10, which is connected to the lead frame 13 via conductive wires 14. Wavelength converting member 12 may be of a simple sloped surface, but in this embodiment, the inside of wavelength converting member 12 is bowl-shaped. In particular, the inside of wavelength converting member 12 is preferably designed substantially like a portion of a paraboloid of revolution, an ellipsoid of revolution, or a hyperboloid of revolution. The molded item 15 is provided inside of the bowl-shaped wavelength converting member 12. The intensity of the emission of the second phosphor is relatively lower than the intensity of the emission of the first phosphor. Therefore, to obtain the desired emission intensity with the desired emission color, it is necessary either to thicken the layer containing the phosphors or to extend the creepage distance of the inside of the wavelength converting member. By designing the inside of the reflector portion to have a bowl-shape, the creepage distance thereof can be extended, resulting in a light-emitting device that is smaller in size than light-emitting devices of the same capability that are equipped with a reflector portion of other shapes. Light-emitting devices encompassed by the scope of the invention can be readily produced by applying wavelength converting member 12 containing the first and second phosphors to the upper surface of a reflector that has been prepared beforehand.

The embodiments of the present invention shown in FIGS. 6 to 10 are applicable also to light-emitting devices of a side view type that emit light in the direction parallel to their mounting planes.

Figure 11:
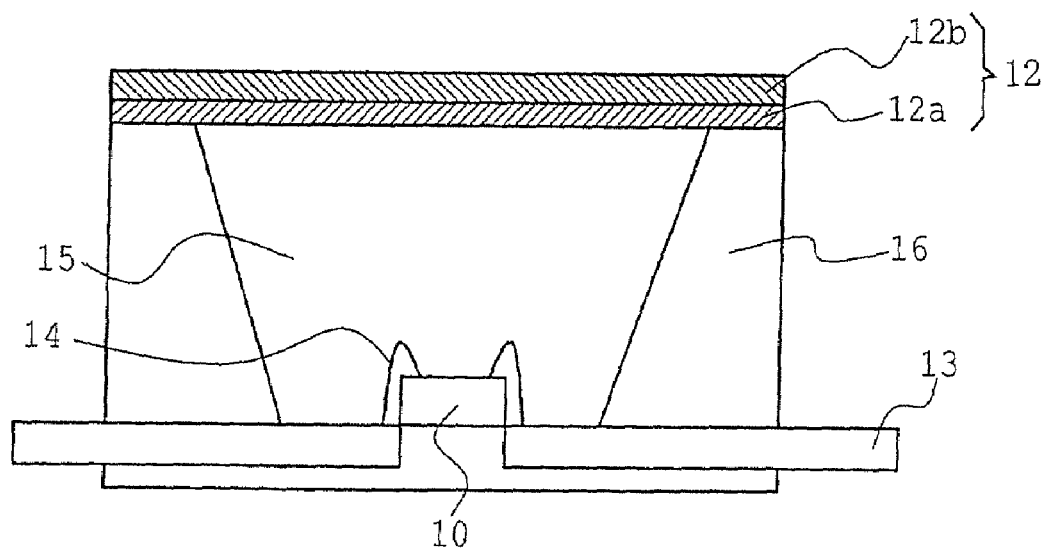
FIG. 11 is a sectional view of a light-emitting device in yet another embodiment of the invention.

FIG. 11 is a sectional view of a light-emitting device of yet another embodiment of the invention. In this device, molded item 15 is positioned in contact with LED chip 10, which is mounted inside the package 16, in such a way that molded item 15 covers LED chip 10, and wavelength converting member 12 containing the first and second phosphors is disposed at the top of molded item 15. The first and second phosphors are prepared as described above. A gallium nitride-based compound semiconductor that emits light in the range of 360 to 580 nm is used for the LED chip. LED chip 10 is connected to the lead frame 13 via conductive wires 14. As in this embodiment, by positioning wavelength converting member 12 containing a translucent material to maintain some distance from the LED chip, the degradation of the phosphors can be prevented. In this embodiment, wavelength converting member 12 is composed of a translucent material containing the first and second phosphors. It is possible to use the first and second phosphors as a mixture in wavelength converting member 12. However, by creating a layer of wavelength converting member 12a containing the first phosphor and a layer of wavelength converting member 12b containing the second phosphor, and positioning the layer 12a containing the first phosphor closer to the light source, i.e., the LED chip, an effect of the invention, i.e., the creation of excellent mixed-color light emissions, can be attained, and the degradation of the second phosphor can be prevented. Moreover, as in this embodiment, placing wavelength converting member 12 such that it covers the top portion of molded item 15 and package 16 prevents moisture and gas from entering the light-emitting device.

Figure 12:
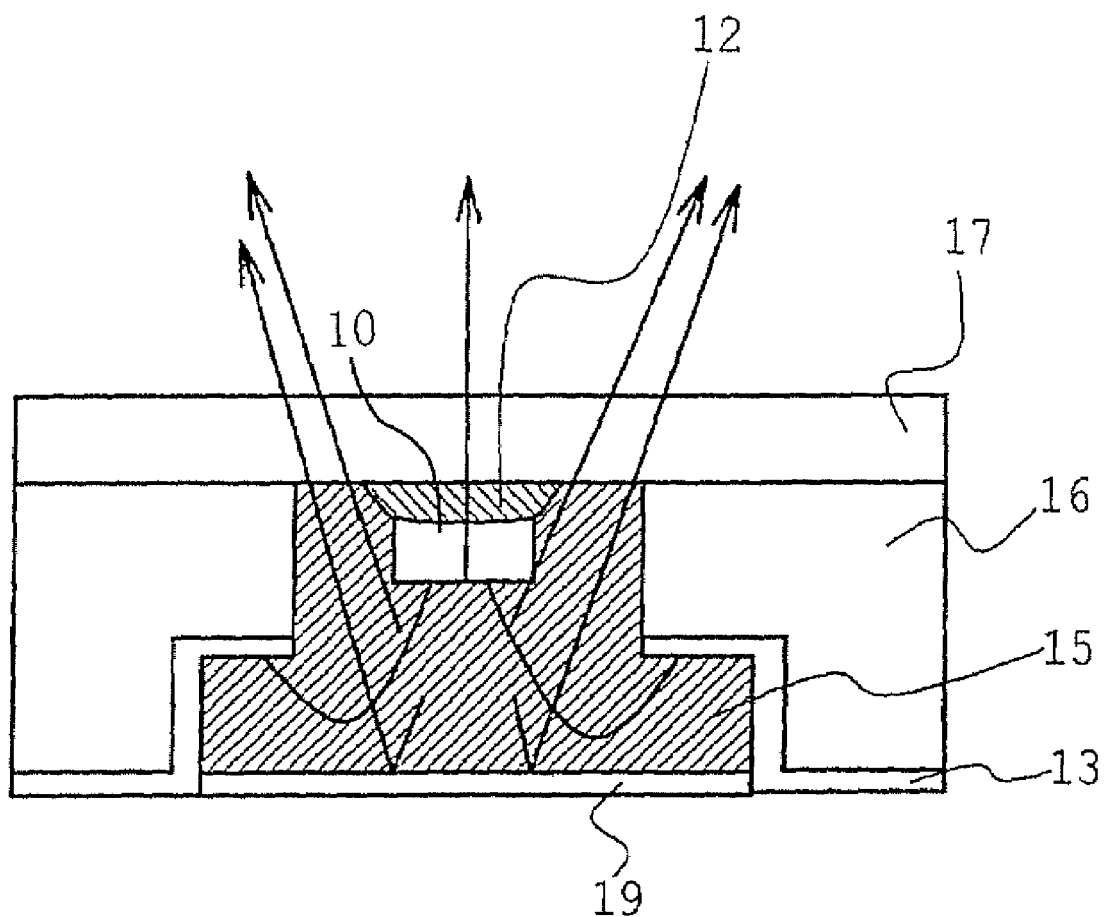
FIG. 12 is a sectional view of a light-emitting device in yet another embodiment of the invention.

FIG. 12 is a sectional view of a light-emitting device of yet another embodiment of the invention. This device contains molded item 15 and LED chip 10 composed of a semiconductor light-emitting element mounted on translucent support 17 with wavelength converting member 12 disposed therebetween. Wavelength converting member 12 is composed of an adhesive made of a translucent material containing the first and second phosphors. Molded item 15 preferably contains the first and second phosphors. Lead frames 13 for supplying electricity are mounted in package 16, which is formed separately from translucent support 17, and connected by conductive wires 14 with electrodes created on the plane opposing the mounting plane of LED chip 10. Phosphors produced as described above are used for the first and second phosphors. A gallium nitride-based compound semiconductor that emits light in the range of 360 to 580 nm is used for the LED chip. Such a construction allows the light emitted from LED chip 10 to be released outside through translucent support 17. In this instance, the phosphors contained in the adhesive (wavelength converting member 12) that secures LED chip 10 convert the light. That is, the light emitted from LED chip 10, the light that is wavelength-converted by the first phosphor, and the light that is wavelength-converted by the second phosphor create a mixed-color emission. Light emitted from the side of LED chip 10 and from the electrode-created plane facing in the direction opposing translucent support 17 is wavelength-converted by the first and second phosphors contained in molded item 15. Such light is reflected into the direction of translucent support 17 by reflective member 19 disposed on the side on which the light-emitting device is mounted and by lead frames 13 installed in the package, thereby reducing the loss of light. The efficiency of light reflection can be enhanced by creating lead frames 13 over the entire side surface of package 16. Moreover, the absorption of light by package 16 can be lessened by creating package 16 from a white material. Light can be more efficiently wavelength-converted by, for example, using the first and second phosphors in translucent support 17.

The construction in which the first and second phosphors are used in an adhesive is applicable to light-emitting devices other than the one shown in FIG. 12 in which the light emitted by LED chip 10 is released from the side of a translucent substrate, i.e., translucent support 17.

Figure 13:
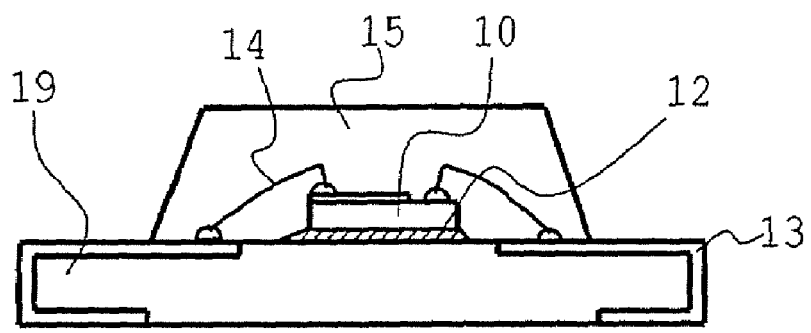
FIG. 13 includes sectional views (a) and (b) showing examples of a light-emitting device in yet another embodiment of the invention.
Figure 13:
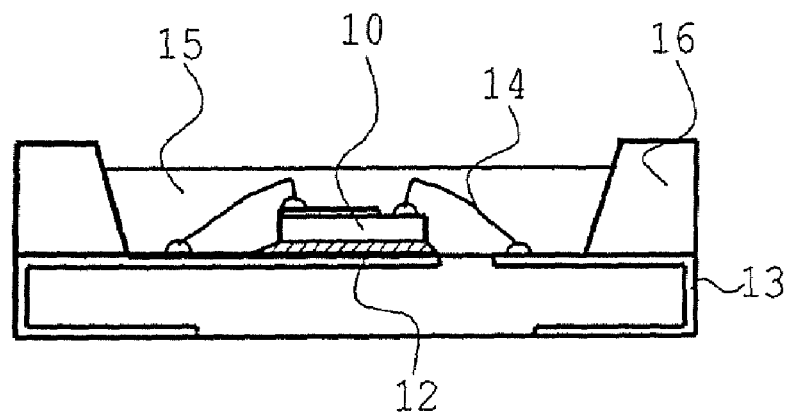

The light-emitting devices shown in FIG. 13(a) and FIG. 13(b) are specific examples of such embodiments. In these light-emitting devices, one or a plurality of LED chips 10 are mounted on substrate or in package 16, and the LED chip(s) 10 are covered by molded item 15. LED chip(s) are secured in the concave portion of package 16 by wavelength converting member 12 containing the first and second phosphors. LED chip 10 is connected to the lead frame 13 via conductive wires 14. In LED chip 10, a semiconductor layer is laminated on a translucent substrate made from sapphire and the like, and n- and p-electrodes are formed on the semiconductor layer. Therefore, light released in the direction of the semiconductor layer is reflected by electrodes and conductive wires, and a relatively large proportion of light emitted by the active layer travels toward the translucent substrate. Thus, by securing LED chip 10 on substrate or the like by means of wavelength converting member 12 composed of an adhesive containing the first and second phosphors, light can be readily and relatively efficiently wavelength-converted.

Figure 14:
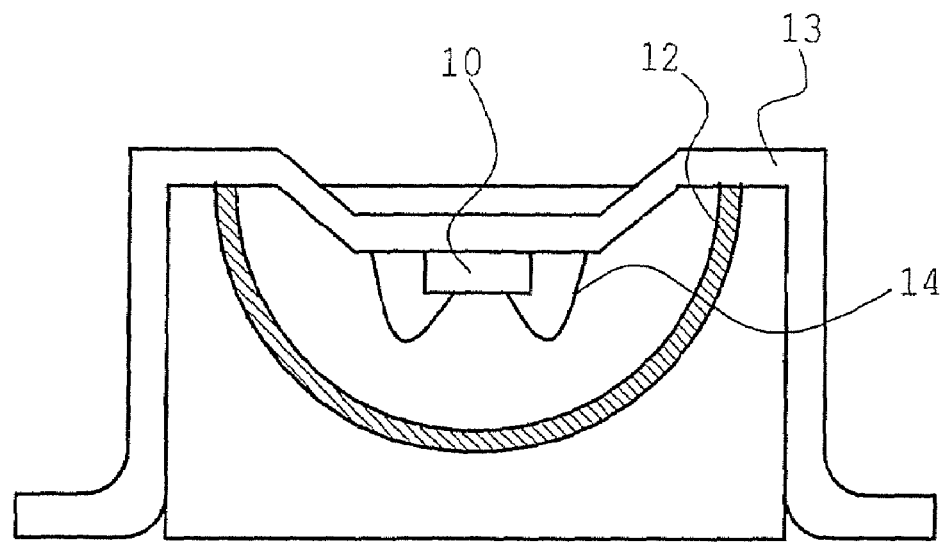
FIG. 14 is a sectional view of a reflective light-emitting device in an embodiment of the invention.

FIG. 14 is a sectional view of a light-emitting device of yet another embodiment of the invention. This reflective-type light-emitting device has LED chip 10 and a concave-curved reflective surface which is coated with wavelength converting member 12 containing the first and second phosphors of the invention. Phosphors produced as described above are used for the first and second phosphors. A gallium nitride-based compound semiconductor that emits light in the range of 360 to 580 nm is used for the LED chip. Such a construction allows light emitted by LED chip 10 due to electricity supplied through lead frame 13 via conductive wires 14 to be reflected by the reflective surface for external release, and a portion of the light emitted by LED chip 10 to be wavelength-converted by wavelength converting member 12, thereby enabling a mixed-color emission created by the light that is emitted from LED chip 10 and the light that is wavelength-converted by wavelength converting member 12 to be obtained and a uniform white emission to be efficiently obtained by a relatively simple construction.

Figure 15:
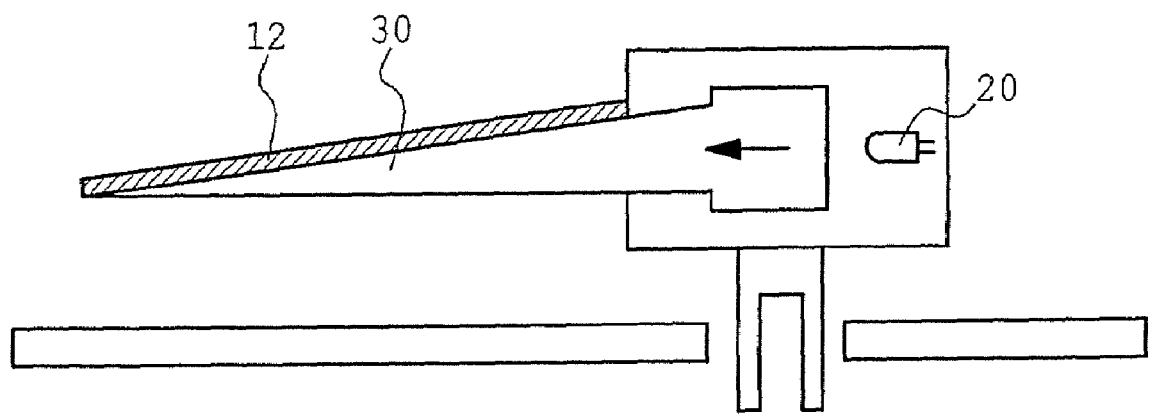
FIG. 15 is a sectional view of a planar light-emitting device in an embodiment of the invention.

FIG. 15 is a sectional view of a light-emitting device of yet another embodiment of the invention. In this device, light-emitting member 20 is provided at one end of needle-shaped light guide plate 30, and wavelength converting member 12 containing the first and second phosphors is disposed on the front surface of light guide plate 30. The wavelength converting member disposed on light guide plate 30 is preferably two-layered. For such a construction, a wavelength converting member containing the first phosphor is applied to the waveguide, and a wavelength converting member containing the second phosphor is then applied thereon, thereby forming wavelength converting member 12. The light that is emitted by light-emitting member 20 disposed at one end of waveguide 30 enters the waveguide from the entrance plane/surface, travels through the interior of the waveguide, and exits from the light-emitting surface In this instance, the light excites the first phosphor provided on the light-emitting plane of waveguide 30, thereby producing an emission having the first emission spectrum. The second phosphor provided on the first phosphor then at least partially converts the first emission spectrum, thereby producing an emission having the second emission spectrum. The light-emitting devices shown in FIGS. 5 and 6 can be suitably used for the light-emitting member 20.

Such a construction enables a mixed-color emission to be created by the emission of light-emitting member 20, the first emission spectrum and the second emission spectrum. Due to the first phosphor being positioned closer to the light source than the second phosphor, the first phosphor is uniformly excited before the second phosphor, thereby giving a good color conversion efficiency. Emissions released from the light-emitting plane of waveguide 30 thereby have an enhanced color mixture, resulting in the creation of emissions having a uniform color. For example, when a blue-light-emitting first phosphor and a red-light-emitting second phosphor are used, the emission by light-emitting member 20 while power is supplied excites both the first phosphor and the second phosphor, and a white emission is then created by the mixing of the respective emissions. After the power supply is terminated, the second phosphor is excited by the afterglow of the first phosphor, and a white emission is obtained due to the mixing of the emissions by the first and second phosphors. Given such a characteristic, when the light-emitting device is applied to a needle on an automobile meter, the instrument cluster can be kept illuminated for a while even though the vehicle is not in operation, e.g., after the power is turned off, thereby creating with less energy a user-friendly in-car environment.

Figure 16:
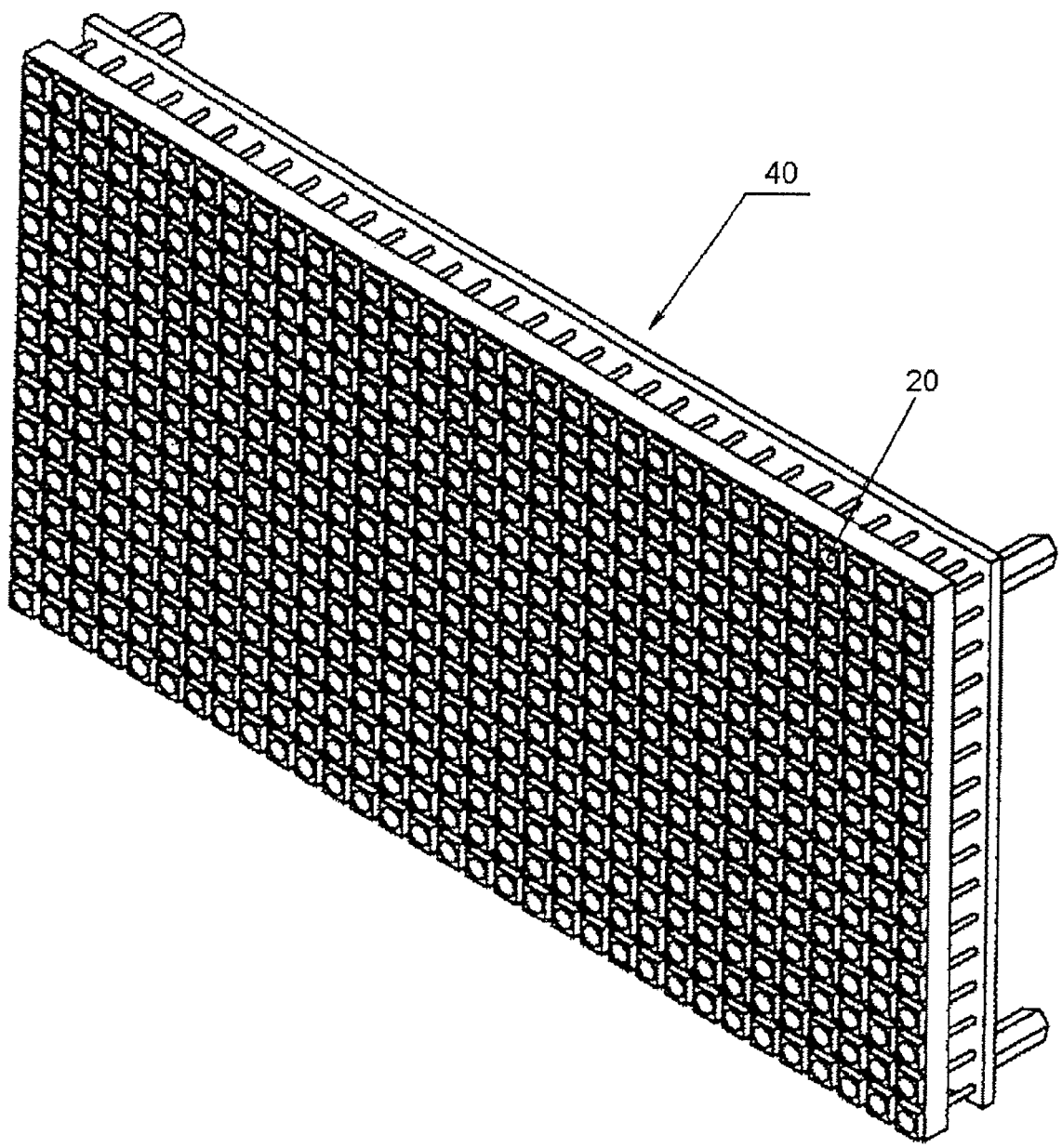
FIG. 16 is a perspective view of an LED display in an embodiment of the invention.

FIG. 16 is a perspective view of a display unit of one embodiment of the invention. This display unit is an example of the application of the light-emitting device of the invention to an LED indicator in which light-emitting devices can be arranged in a desired order for use in the form of sign board, arrow, etc. Light-emitting devices 20 composed of LED chips whose light-emitting surface and side surface are coated with a coating member containing the first and second phosphors are arranged in this display unit. Light-emitting devices 20 are connected to a drive circuit (not shown) mounted on the backside of the display unit, and the display unit then functions as an indicator. LED indicator 40 is electrically connected to a drive circuit, i.e., a lighting circuit, and the desired light-emitting devices 20 are lit by an output pulse from the drive circuit, thereby allowing the light-emitting devices 20 to function as an indicator. The drive circuit is equipped with a random access memory (RAM) that temporarily stores input data, a gradation control circuit that calculates gradation signals to light up light-emitting devices in the desired luminosity based on data stored in the RAM, and a driver that lights up light-emitting devices according to switching due to the output signals of the gradation control circuit. The gradation control circuit calculates the duration of illuminating light-emitting devices based on data stored in the RAM and provides output as pulse signals. When light-emitting devices 20 are illuminated, the emissions of the first and second phosphors are displayed as well as the emission of light-emitting devices 20. When the light-emitting devices 20 are turned off, a mixed-color emission created by the afterglow of the first phosphor and the emission of the second phosphor is displayed, in which the second phosphor is excited by the afterglow of the first phosphor and then converts at least a portion of the afterglow spectrum of the first phosphor and emits light having another emission spectrum. By altering the wavelengths of the light-emitting devices and of the afterglow by suitably selecting the type of phosphors used, various color tones, especially white, can be obtained. With respect to the display unit shown in FIG. 16, a white emission can be created by mixing the emissions of the first and second phosphors. Therefore, an indicator that can display a white color both with and without power can be created. In this regard, LED indicator 40 can emit the desired color with low power consumption and sufficiently attract attention during night and like situations.

EXAMPLES

Examples are given below to describe the present invention in more detail. However, the scope of the invention is not limited to or by these examples.

1. Production of Phosphors

Example 1

144.7 g of $SrCO_3$, 178.4 g of $Al_2O_3$, 1.8 g of $Eu_2O_3$, and 1.9 g of $Dy_2O_3$ were measured and then sufficiently mixed in a ball mill. The mixed ingredients were introduced into an alumina crucible and calcined in a reducing atmosphere of $N_2$ and $H_2$ at 1200 to 1400° C. for about 3 hours. The calcined product thus obtained was pulverized, dispersed, sieved, separated, water-washed, and dried, thereby yielding a first phosphor.

The first phosphor had an Sr:Eu:Dy composition of 0.98: 0.01:0.01, and an (Sr/Eu/Dy):Al:O composition of 4:14:25.

Next, 12.9 g of $Y_2O_3$, 31.0 g of $Gd_2O_3$, 2.6 g of $CeO_2$, and 51.0 g of $Al_2O_3$ were measured and then sufficiently mixed in a ball mill. The mixed ingredients were introduced into an alumina crucible and calcined in a reducing atmosphere of $N_2$ and $H_2$ at 1300 to 1500° C. for about 3 hours. The calcined product thus obtained was pulverized, dispersed, sieved, separated, water-washed, and dried, thereby yielding a second phosphor.

The second phosphor had a Y:Gd:Ce composition of 0.38: 0.57:0.05, and a (Y/Gd/Ce):Al:O composition of 3:5:12.

The first phosphor and the second phosphor thus obtained were uniformly mixed in a weight ratio of 7 to 3 (first phosphor/second phosphor=7/3), thereby yielding a fluorescent material of the invention.

Example 2

The first and second phosphors as obtained in Example 1 were uniformly mixed in a weight ratio of 4 to 6, thereby yielding a fluorescent material of the invention.

Example 3

98.1 g of $CaCO_3$, 101.9 g of $Al_2O_3$, 1.8 g of $Eu_2O_3$, and 1.7 g of $Nd_2O_3$ were measured and then sufficiently mixed in a ball mill. The mixed ingredients were introduced into an alumina crucible and calcined in a reducing atmosphere of $N_2$ and $H_2$ at 1200 to 1400° C. for about 3 hours. The calcined product thus obtained was pulverized, dispersed, sieved, separated, water-washed, and dried, thereby yielding a first phosphor.

The first phosphor had a Ca:Eu:Nd:Al:O composition of 0.98:0.01:0.01:2:4.

Next, 30.48 g of $Y_2O_3$, 2.7 g of $Gd_2O_3$, 2.6 g of $CeO_2$, and 51.0 g of $Al_2O_3$ were measured and then sufficiently mixed in a ball mill. The mixed ingredients were introduced into an alumina crucible and calcined in a reducing atmosphere of $N_2$ and $H_2$ at 1300 to 1500° C. for about 3 hours. The calcined product thus obtained was pulverized, dispersed, sieved, separated, water-washed, and dried, thereby yielding a second phosphor.

The second phosphor had a Y:Gd:Ce composition of 0.90: 0.05:0.05, and a (Y/Gd/Ce):Al:O composition of 3:5:12.

The first phosphor and the second phosphor thus obtained were uniformly mixed in a weight ratio of 7 to 3, thereby yielding a fluorescent material of the invention.

Example 4

The first and second phosphors as obtained in Example 3 were uniformly mixed in a weight ratio of 4 to 6, thereby yielding a fluorescent material of the invention.

Example 5

56.7 g of $Lu_2O_3$, 2.6 g of $CeO_2$, and 51.0 g of $Al_2O_3$ were measured and then sufficiently mixed in a ball mill. The mixed ingredients were introduced into an alumina crucible and calcined in the ambient atmosphere at 1300 to 1500° C. for about 3 hours. The calcined product thus obtained was pulverized, dispersed, sieved, separated, water-washed, and dried, thereby yielding a second phosphor.

The second phosphor had an Lu:Ce composition of 0.95: 0.05, and an (Lu/Ce):Al:O composition of 3:5:12.

The first phosphor as obtained in Example 3 and the second phosphor obtained in this Example were uniformly mixed in a weight ratio of 7 to 3, thereby yielding a fluorescent material of the invention.

Example 6

The first phosphor as obtained in Example 3 and the second phosphor as obtained in Example 5 were uniformly mixed in a weight ratio of 4 to 6, thereby yielding a fluorescent material of the invention.

Example 7

43.5 g of $Ca_3N_2$, 7.3 g of $Ba_3N_2$, and 4.9 g of $Sr_3N_2$, 116.9 g of $Si_3N_4$, and 3.52 g of $Eu_2O_3$ were measured and then sufficiently mixed in a ball mill. The mixed ingredients were introduced into a BN crucible and calcined in a reducing atmosphere of $N_2$ and $H_2$ at 1300 to 1500° C. for about 3 hours. The calcined product thus obtained was pulverized, dispersed, sieved, separated, water-washed, and dried, thereby yielding a second phosphor.

The second phosphor had a Ca:Sr:Ba:Eu composition of 0.88:0.05:0.05:0.02, and a (Ca/Sr/Ba/Eu):Si:N composition of 2:5:8.

The first phosphor as obtained in Example 3 and the second phosphor obtained in this Example were uniformly mixed in a weight ratio of 7 to 3, thereby yielding a fluorescent material of the invention.

Example 8

The first phosphor as obtained in Example 3 and the second phosphor as obtained in Example 7 were uniformly mixed in a weight ratio of 4 to 6, thereby yielding a fluorescent material of the invention.

Example 9

43.5 g of $Ca_3N_2$, 4.9 g of $Sr_3N_2$, 7.3 g of $Ba_3N_2$, 46.8 g of $Si_3N_4$, 60.1 g of $SiO_2$, and 3.52 g of $Eu_2O_3$ were measured and then sufficiently mixed in a ball mill. The mixed ingredients were introduced into an alumina crucible and calcined in a reducing atmosphere of $N_2$ and $H_2$ at 1300 to 1500° C. for about 3 hours. The calcined product thus obtained was pulverized, dispersed, sieved, separated, water-washed, and dried, thereby yielding a second phosphor.

The second phosphor had a Ca:Sr:Ba:Eu:Si:O:N composition of 0.88:0.05:0.5:0.02:2:2:2.

The first phosphor as obtained in Example 3 and the second phosphor as obtained in this Example were uniformly mixed in a weight ratio of 7 to 3, thereby yielding a fluorescent material of the invention.

Example 10

The first phosphor as obtained in Example 3 and the second phosphor as obtained in Example 9 were uniformly mixed in a weight ratio of 4 to 6, thereby yielding a fluorescent material of the invention.

Example 11

The first phosphor as obtained in Example 1 and the second phosphor as obtained in Example 7 were uniformly mixed in a weight ratio of 7 to 3, thereby yielding a fluorescent material of the invention.

Example 12

The first phosphor as obtained in Example 1 and the second phosphor as obtained in Example 7 were uniformly mixed in a weight ratio of 4 to 6, thereby yielding a fluorescent material of the invention.

Example 13

72.4 g of $SrCO_3$, 0.88 g of $Eu_2O_3$, 0.93 g of $Dy_2O_3$, and 51.0 g of $Al_2O_3$ were measured and then sufficiently mixed in a ball mill. The mixed ingredients were introduced into an alumina crucible and calcined in a reducing atmosphere of $N_2$ and $H_2$ at 1200 to 1400° C. for about 3 hours. The calcined product thus obtained was pulverized, dispersed, sieved, separated, water-washed, and dried, thereby yielding a first phosphor.

The first phosphor thus obtained had an Sr:Eu:Dy:Al:O composition of 0.98:0.01:0.01:2:4.

The first phosphor as obtained in this Example and the second phosphor as obtained in Example 7 were uniformly mixed in a weight ratio of 7 to 3, thereby yielding a fluorescent material of the invention.

Example 14

The first phosphor as obtained in Example 13 and the second phosphor as obtained in Example 7 were uniformly mixed in a weight ratio of 4 to 6, thereby yielding a fluorescent material of the invention.

Example 15

The first phosphor as obtained in Example 3, the first phosphor as obtained in Example 1, and the second phosphor as obtained in Example 3 were uniformly mixed in a weight ratio of 3 to 4 to 3, thereby yielding a fluorescent material of the invention.

Example 16

The first phosphor as obtained in Example 3, the first phosphor as obtained in Example 1, and the second phosphor as obtained in Example 3 were uniformly mixed in a weight ratio of 2 to 2 to 6, thereby yielding a fluorescent material of the invention.

Example 17

The first phosphor as obtained in Example 3, the first phosphor as obtained in Example 1, and the second phosphor as obtained in Example 7 were uniformly mixed in a weight ratio of 2 to 5 to 3, thereby yielding a fluorescent material of the invention.

Example 18

The first phosphor as obtained in Example 3, the first phosphor as obtained in Example 1, and the second phosphor as obtained in Example 7 were uniformly mixed in a weight ratio of 1.5 to 2.5 to 6, thereby yielding a fluorescent material of the invention.

2. Evaluation of Fluorescent Materials

The fluorescent materials obtained above were excited for 15 minutes by ultraviolet irradiation having a 365.0 nm wavelength using a black light lamp (intensity: 0.5 $mW/cm^2$) as an excitation source. The luminosity and color of the afterglow of the fluorescent materials were measured 1 minute and 10 minutes after excitation was terminated.

Table 1 shows the results.

TABLE 1

| | Excitation by wavelength of 365.0 nm | | | |
|---|---|---|---|---|
| | Afterglow after 1 minute | | Afterglow after 10 minutes | |
| | Luminosity ($cd/m^2$) | Color (x/y) | Luminosity ($cd/m^2$) | Color (x/y) |
| Ex. 1 | 2.55 | 0.354/0.489 | 0.34 | 0.360/0.490 |
| Ex. 2 | 1.90 | 0.396/0.497 | 0.23 | 0.405/0.494 |
| Ex. 3 | 1.30 | 0.362/0.354 | 0.23 | 0.367/0.360 |
| Ex. 4 | 0.91 | 0.411/0.416 | 0.15 | 0.415/0.419 |
| Ex. 5 | 1.41 | 0.275/0.398 | 0.25 | 0.279/0.402 |
| Ex. 6 | 2.44 | 0.305/0.470 | 0.32 | 0.309/0.472 |
| Ex. 7 | 0.83 | 0.455/0.211 | 0.13 | 0.456/0.216 |
| Ex. 8 | 0.70 | 0.551/0.256 | 0.10 | 0.550/0.257 |
| Ex. 9 | 1.15 | 0.155/0.352 | 0.20 | 0.155/0.357 |
| Ex. 10 | 0.84 | 0.157/0.448 | 0.14 | 0.157/0.451 |
| Ex. 11 | 1.64 | 0.410/0.333 | 0.27 | 0.412/0.335 |
| Ex. 12 | 1.05 | 0.501/0.331 | 0.16 | 0.503/0.333 |
| Ex. 13 | 0.88 | 0.503/0.425 | 0.14 | 0.505/0.427 |
| Ex. 14 | 0.65 | 0.558/0.385 | 0.08 | 0.560/0.386 |
| Ex. 15 | 1.85 | 0.302/0.375 | 0.29 | 0.305/0.378 |
| Ex. 16 | 1.40 | 0.372/0.440 | 0.24 | 0.373/0.445 |
| Ex. 17 | 1.45 | 0.350/0.301 | 0.24 | 0.352/0.292 |
| Ex. 18 | 0.96 | 0.489/0.305 | 0.15 | 0.495/0.297 |

As shown in Table 1, since the fluorescent materials of the invention emit light across a very broad chromatic range, they can emit light in a desired color. The fluorescent materials have the property of producing an afterglow of high luminosity. Moreover, the chromaticity of their afterglow barely changes over time.

3. Lamp Production

Example 19

The fluorescent material as obtained in Example 1 and a 3-wavelength fluorescent material (composed of a $BaMgAl_{10}O_{17}$:Eu blue-light-emitting phosphor having a peak emission wavelength of 453 nm (36%), an $LaPO_4$:Ce,Tb green-light-emitting phosphor having a peak emission wavelength of 544 nm (32%), and a $Y_2O_3$:Eu red-light-emitting phosphor having a peak emission wavelength of 611 nm (32%)) were sufficiently mixed in a weight ratio of 1 to 4.

The mixed fluorescent materials (20 g) and a nitrocellulose/butyl acetate binder (20 g) were sufficiently mixed in a magnetic pot mill to prepare a fluorescent material coating slurry. This slurry was poured into an FL40SS glass tube to coat its inner surface, the coated surface was dried by warm air, and the coated bulb was baked at 580° C. for 15 minutes, thereby forming a phosphor film.

Thereafter, ventilation, filament mounting, and cap installation were performed according to usual procedures, thereby producing a lamp of the present invention.

Example 20

A lamp of the present invention was produced in the manner described in Example 19 except that the fluorescent material as obtained in Example 3 was used in place of the fluorescent material of Example 1.

4. Lamp Evaluation

The chromaticity coordinates and the total luminous flux of the lamps obtained above were measured at 40 W using an integrating sphere (manufactured by Nemurakku, type 1800).

Table 2 shows the results.

TABLE 2

| | Lamp properties | | |
|---|---|---|---|
| | Chromaticity coordinates | | Total luminous flux |
| | x | y | (lm) |
| Ex. 19 | 0.313 | 0.317 | 3495 |
| Ex. 20 | 0.314 | 0.316 | 3472 |

As shown in Table 2, the afterglow of the lamps of the invention has chromaticity coordinates and total luminous flux values that are identical to those of an ordinary three-wavelength lamp. In other words, lamps obtained according to the invention have an afterglow that is similar to the light created by an ordinary three-wavelength lamp; the afterglow is highly luminous across a very broad chromatic range; and the chromaticity of the afterglow stays consistent for a long period of time.

Example 21

140.5 g of $SrCO_3$, 169.4 g of $Al_2O_3$, 5.3 g of $Eu_2O_3$, 2.8 g of $Dy_2O_3$, and 10.8 g of $H_3BO_3$ are measured and then sufficiently mixed in a ball mill. The mixed ingredients are introduced into an alumina crucible and calcined in a reducing atmosphere of $N_2$ and $H_2$ at 1200 to 1400° C. for about 3 hours. The calcined product thus obtained is pulverized, dispersed, sieved, separated, water-washed, and dried, thereby yielding a first phosphor.

The first phosphor thus obtained has an Sr:Eu:Dy composition of 0.952:0.03:0.015, and an (Sr/Eu/Dy):(Al/B):o composition of 4:14:25.

The first phosphor obtained in Example 21 and the second phosphor as obtained in Example 1 are uniformly mixed in a weight ratio of 7 to 3, thereby yielding a fluorescent material of the invention.

Example 22

The first phosphor as obtained in Example 21 and the second phosphor as obtained in Example 3 are uniformly mixed in a weight ratio of 4 to 6 to give a fluorescent material of the invention.

Example 23

The first phosphor as obtained in Example 21 and the second phosphor as obtained in Example 5 are uniformly mixed in a weight ratio of 7 to 3 to give a fluorescent material of the invention.

Example 24

The first phosphor as obtained in Example 21, the first phosphor as obtained in Example 3, and the second phosphor as obtained in Example 3 are uniformly mixed in a weight ratio of 3 to 4 to 3 to give a fluorescent material of the invention.

Example 25

The first phosphor as obtained in Example 21, the first phosphor as obtained in Example 3, and the second phosphor as obtained in Example 5 are uniformly mixed in a weight ratio of 2 to 5 to 3 to give a fluorescent material of the invention.

The fluorescent materials according to the embodiments described above can emit an afterglow of high luminosity across a very broad chromatic range. Furthermore, they can maintain their afterglow for a long period of time with a uniform or substantially uniform chromaticity. In other words, the chromaticity of their afterglow does not change for a long period of time, or is unlikely to change.

The fluorescent material according to the embodiments described above can emit light having a uniform chromaticity due to the first phosphor and the second phosphor being disposed in the form of layers.

The lamps according to the embodiments described above can emit an afterglow of high luminosity across a very broad chromatic range. Furthermore, they can maintain their afterglow for a long period of time with a uniform or substantially uniform chromaticity. In other words, the chromaticity of their afterglow does not change for a long period of time, or is unlikely to change. Since the first phosphor therein has a light storage property, the lamps can emit light even after the conversion of electric energy into light energy by the light-emitting body is terminated, thereby eliminating the need for a standby power source for emergency situations.

The lamp according to the embodiments described above can emit light having a uniform chromaticity due to the first phosphor and the second phosphor being disposed in the form of layers.

The light-emitting devices according to the embodiments described above can emit an afterglow of high luminosity across a very broad chromatic range. Furthermore, they can maintain their afterglow for a long period of time with a uniform or substantially uniform chromaticity. In other words, the chromaticity of their afterglow does not change for a long period of time, or is unlikely to change. Moreover, the light-emitting devices can emit light having a whitish chromaticity not only while power is supplied but also after the termination of the power supply, i.e., during no power supply, thereby enabling a low power consumption. Moreover, their power consumption can be further reduced by repetitively turning the power supply to the light-emitting devices on and off. The light-emitting devices can also be designed to emit light in similar colors during the states of power supply and no power supply.

The light-emitting device according to the embodiments described above can emit light having a uniform chromaticity due to the first phosphor and the second phosphor being disposed in the form of layers.

We claim:

1. A fluorescent material comprising a first phosphor that at least partially converts energy emitted by an excitation source to a first emission spectrum that is different from the energy, and a second phosphor that at least partially converts the first emission spectrum to a second emission spectrum that is different from the first emission spectrum, wherein the first phosphor is a light-storing phosphor, which is a phosphor which is represented by the general formula:

$(M_{1-a-b}Eu_aQ_b)Al_2O_4$ wherein M is at least one type selected from the group consisting of Mg, Ca, Ba, Sr and Zn; Q is at least one type selected from the group consisting of Pr, Nd, Dy, Er and Ho; a is a number that satisfies $0.0001 \leq a \leq 0.5$ and b is a number that satisfies $0.0001 \leq b \leq 0.5$, a peak wavelength of the emission spectrum of the first phosphor and a peak wavelength of the emission spectrum of the second phosphor have a relation of complementary colors, so that when the light created due to the peak wavelength of the first phosphor and the light created due to the peak wavelength of the second phosphor are mixed, the resulting light is in the white region, and the first and second phosphors are configured and arranged so that, when the fluorescent material is excited for about 15 minutes by ultraviolet irradiation having about 365.0 nm wavelength using a black light lamp with an intensity of 0.5 mW/cm² as an excitation source, and the color of the afterglow of the fluorescent material is measured 1 minute and 10 minutes after excitation is terminated, an amount of change between chromaticity of the afterglow measured 1 minute after excitation and that measured 10 minutes after excitation is in the range of $-0.001 \leq x \leq 0.009$ and $-0.009 \leq y \leq 0.006$.

2. The fluorescent material according to claim 1, wherein the second phosphor, even after the termination of an energy supply from the excitation source, at least partially converts the first emission spectrum.

3. The fluorescent material according to claim 1, wherein the first phosphor and the second phosphor are disposed in the form of layers.

4. The fluorescent material according to claim 1, wherein the second phosphor is at least one type selected from the group consisting of phosphors (9), (11) and (15):

(9) one type selected from the group consisting of a cerium-activated yttrium aluminum oxide-based phosphor wherein Y that has been entirely or partially substituted by at least one element selected from the group consisting of Lu, Sc, La, Gd, Pr, Tb and Sm; Al; and O are activated by cerium;

a cerium-activated rare-earth aluminum oxide-based phosphor wherein Y that has been entirely or partially substituted by at least one element selected from the group consisting of Lu, Sc, La, Gd, Pr, Tb and Sm; Al; at least one element selected from the group consisting of Tl, Ga and In; and O are activated by Ce; and a cerium-activated rare-earth aluminum oxide-based phosphor wherein Y that has been entirely or partially substituted by at least one element selected from the group consisting of Lu, Sc, La, Gd, Pr, Tb and Sm; at least one element selected from the group consisting of Al, Tl, Ga and In; and O are activated by Ce;

(11) a nitride-based phosphor wherein at least one element L selected from the group consisting of Be, Mg, Ca, Sr, Ba and Zn; at least one element D selected from the group consisting of C, Si, Ge, Sn, Ti, Zr and Hf and N are activated by element R selected from the group consisting of Y, La, Ce, Pr, Nd, Sm, Eu, Gd, Tb, Dy, Ho, Er and Lu; and

(15) a silicate-based phosphor wherein at least one element L selected from the group consisting of Be, Mg, Ca, Sr, Ba and Zn; O; and Si are activated by Eu.

5. A lamp comprising a light-emitting body that converts electric energy into light energy and a translucent glass covering the light-emitting body, wherein a phosphor layer is provided on at least the inner or outer surface of the translucent glass, and the phosphor layer comprises the fluorescent material cited in claim 1.

6. The lamp according to claim 5, wherein the second phosphor, even after the termination of an energy supply by an excitation source, at least partially converts the first emission spectrum.

7. The lamp according to claim 5, wherein the first phosphor and the second phosphor are disposed in the form of layers.

8. The lamp according to claim 5, wherein the second phosphor is at least one type selected from the group consisting of phosphors (9), (11) and (15):

(9) one type selected from the group consisting of a cerium-activated yttrium aluminum oxide-based phosphor wherein Y that has been entirely or partially substituted by at least one element selected from the group consisting of Lu, Sc, La, Gd, Pr, Tb and Sm; Al; and O are activated by cerium;

a cerium-activated rare-earth aluminum oxide-based phosphor wherein Y that has been entirely or partially substituted by at least one element selected from the group consisting of Lu, Sc, La, Gd, Pr, Tb and Sm; Al; at least one element selected from the group consisting of Tl, Ga and In; and O are activated by Ce; and a cerium-activated rare-earth aluminum oxide-based phosphor wherein Y that has been entirely or partially substituted by at least one element selected from the group consisting of Lu, Sc, La, Gd, Pr, Tb and Sm; at least one element selected from the group consisting of Al, Tl, Ga and In; and O are activated by Ce;

(11) a nitride-based phosphor wherein at least one element L selected from the group consisting of Be, Mg, Ca, Sr, Ba and Zn; at least one element D selected from the group consisting of C, Si, Ge, Sn, Ti, Zr and Hf and N are activated by element R selected from the group consisting of Y, La, Ce, Pr, Nd, Sm, Eu, Gd, Tb, Dy, Ho, Er and Lu; and

(15) a silicate-based phosphor wherein at least one element L selected from the group consisting of Be, Mg, Ca, Sr, Ba and Zn; O; and Si are activated by Eu.

9. A light-emitting device comprising an LED chip and a fluorescent material that at least partially converts the emission spectrum of the LED chip, wherein the fluorescent material is the fluorescent material cited in claim 1, and a mixed-color emission created due to the first emission spectrum of the first phosphor and the second emission spectrum of the second phosphor is whitish.

10. The light-emitting device according to claim 9, wherein the first phosphor and the second phosphor are disposed in the form of layers.

11. The light-emitting device according to claim 9, wherein the second phosphor is at least one type selected from the group consisting of phosphors (9), (11) and (15):

(9) one type selected from the group consisting of a cerium-activated yttrium aluminum oxide-based phosphor wherein Y that has been entirely or partially substituted by at least one element selected from the group consisting of Lu, Sc, La, Gd, Pr, Tb and Sm; Al; and O are activated by cerium;

a cerium-activated rare-earth aluminum oxide-based phosphor wherein Y that has been entirely or partially substituted by at least one element selected from the group consisting of Lu, Sc, La, Gd, Pr, Tb and Sm; Al; at least one element selected from the group consisting of Tl, Ga and In; and O are activated by Ce; and a cerium-activated rare-earth aluminum oxide-based phosphor wherein Y that has been entirely or partially substituted by at least one element selected from the group consisting of Lu, Sc, La, Gd, Pr, Tb and Sm; at least one element selected from the group consisting of Al, Tl, Ga and In; and O are activated by Ce;

(11) a nitride-based phosphor wherein at least one element L selected from the group consisting of Be, Mg, Ca, Sr, Ba and Zn; at least one element D selected from the group consisting of C, Si, Ge, Sn, Ti, Zr and Hf; and N are activated by element R selected from the group consisting of Y, La, Ce, Pr, Nd, Sm, Eu, Gd, Tb, Dy, Ho, Er and Lu; and

(15) a silicate-based phosphor wherein at least one element L selected from the group consisting of Be, Mg, Ca, Sr, Ba and Zn; O; and Si are activated by Eu.

12. A display unit comprising a display equipped with a plurality of the light-emitting devices cited in claim 9, and a drive circuit electrically connected to the display.

* * * * *